(12) United States Patent
Kim et al.

(10) Patent No.: US 11,056,472 B2
(45) Date of Patent: Jul. 6, 2021

(54) STRETCHABLE DISPLAY DEVICE

(71) Applicant: LG Display Co., Ltd., Seoul (KR)

(72) Inventors: Seulki Kim, Seosan-si (KR); JiYoung Ahn, Goyang-si (KR)

(73) Assignee: LG Display Co., Ltd., Seoul (KR)

(*) Notice: Subject to any disclaimer, the term of this patent is extended or adjusted under 35 U.S.C. 154(b) by 31 days.

(21) Appl. No.: 16/595,039

(22) Filed: Oct. 7, 2019

(65) Prior Publication Data

US 2020/0168590 A1     May 28, 2020

(30) Foreign Application Priority Data

Nov. 27, 2018 (KR) .................. 10-2018-0148204

(51) Int. Cl.
| | |
|---|---|
| *H01L 27/32* | (2006.01) |
| *H01L 25/13* | (2006.01) |
| *H01L 23/498* | (2006.01) |
| *H01L 27/12* | (2006.01) |
| *H01L 33/60* | (2010.01) |

(52) U.S. Cl.
CPC .......... *H01L 25/13* (2013.01); *H01L 23/4985* (2013.01); *H01L 23/49833* (2013.01); *H01L 27/124* (2013.01); *H01L 27/326* (2013.01); *H01L 33/60* (2013.01)

(58) Field of Classification Search
None
See application file for complete search history.

(56) References Cited

U.S. PATENT DOCUMENTS

| | | | |
|---|---|---|---|
| 9,111,464 B2 | 8/2015 | Bibl et al. | |
| 9,599,857 B2 | 3/2017 | Bibl et al. | |
| 9,865,577 B2 | 1/2018 | Bibl et al. | |
| 2014/0367633 A1 | 12/2014 | Bibl et al. | |
| 2015/0255439 A1 | 9/2015 | Kim | |
| 2015/0331285 A1 | 11/2015 | Bibl et al. | |
| 2016/0204185 A1* | 7/2016 | Iijima | H01L 51/5253 257/91 |
| 2016/0211471 A1* | 7/2016 | Kwon | H01L 51/5275 |
| 2017/0162553 A1 | 6/2017 | Bibl et al. | |

(Continued)

FOREIGN PATENT DOCUMENTS

| | | |
|---|---|---|
| KR | 10-2016-0010869 A | 1/2016 |
| WO | WO 2017/031153 A1 | 2/2017 |

OTHER PUBLICATIONS

European Patent Office, Extended European Search Report and Opinion, EP Patent Application No. 19201917.2, dated Apr. 2, 2020, seven pages.

*Primary Examiner* — Benjamin P Sandvik
(74) *Attorney, Agent, or Firm* — Fenwick & West LLP

(57) ABSTRACT

Provided is a stretchable display device. The stretchable display device includes a plurality of island substrates which defines a plurality of pixels and is spaced apart from each other, a lower substrate disposed below the plurality of island substrates and a connection line which electrically connects pads disposed on adjacent island substrates among the plurality of island substrates, wherein the upper substrate is made of a stretchable polymer material and includes a plurality of upper patterns overlapping an emission area of the plurality of island substrates and a second upper pattern in an area excluding the plurality of first upper patterns, and wherein the second upper pattern further includes a black pigment.

16 Claims, 11 Drawing Sheets

(56) References Cited

U.S. PATENT DOCUMENTS

| | | | |
|---|---|---|---|
| 2017/0169914 A1* | 6/2017 | Sekitani | C09D 115/02 |
| 2018/0046221 A1 | 2/2018 | Choi et al. | |
| 2018/0114947 A1 | 4/2018 | Kwon | |
| 2020/0201393 A1* | 6/2020 | Ahn | G06F 1/1626 |
| 2020/0243778 A1* | 7/2020 | Li | H01L 27/3258 |
| 2020/0350506 A1* | 11/2020 | Cho | H01L 27/3276 |

* cited by examiner

STRETCHABLE DISPLAY DEVICE

CROSS-REFERENCE TO RELATED APPLICATIONS

This application claims the priority of Republic of Korea Patent Application No. 10-2018-0148204 filed on Nov. 27, 2018, in the Korean Intellectual Property Office, the disclosure of which is incorporated herein by reference in its entirety.

BACKGROUND

Field

The present disclosure relates to a stretchable display device, and more particularly, to a high-resolution micro LED stretchable display device in which a bending or stretching motion of a display device is improved to be free.

Description of the Related Art

As display devices which are used for monitors of a computer, a television, or a cellular phone, there are an organic light emitting display device (OLED) which is a self-emitting device, a liquid crystal display device (LCD) which requires a separate light source, and the like.

An applicable range of the display device is diversified to personal digital assistants as well as monitors of computers and televisions and a display device with a large display area and a reduced volume and weight is being studied.

Recently, a stretchable display device which is manufactured by forming a display unit and a wiring line on a flexible substrate such as plastic which is a flexible material so as to be stretched in a specific direction and changed in various forms is getting attention as a next generation display device.

SUMMARY

An object to be achieved by the present disclosure is to provide a high-resolution stretchable display device using a micro light emitting diode (LED) of the related art even though a rigid area is reduced, by combining individual RGB reflective layers as one layer and disposing a high potential power source line in a gate line direction.

Another object to be achieved by the present disclosure is to provide a stretchable display device which applies a stretchable black polymer material to upper and lower patterned substrates so that even though a polarizer layer is not disposed, external reflection of the display device is effectively reduced.

Still another object to be achieved by the present disclosure is to provide a stretchable display device in which a polymer material of a patterned lower substrate has different moduli in an emission area and a non-emission area so that the display device is bendable or stretchable without causing a damage of a display element disposed on a plurality of rigid substrates.

Still another object to be achieved by the present disclosure is to provide a stretchable display device in which a polymer material of a patterned upper substrate has different refractive indexes in an emission area and a non-emission area so that the display device is easily bendable or stretchable while reducing the damage of a display element and the upper substrate.

Objects of the present disclosure are not limited to the above-mentioned objects, and other objects, which are not mentioned above, can be clearly understood by those skilled in the art from the following descriptions.

According to an aspect of the present disclosure, a stretchable display device includes a plurality of island substrates which defines a plurality of pixels and is spaced apart from each other, a lower substrate disposed below the plurality of island substrates, an upper substrate, and a connection line which electrically connects pads disposed on adjacent island substrates among the plurality of island substrates in which the upper substrate is formed of a stretchable polymer material and includes a plurality of first upper patterns overlapping an emission area of the plurality of island substrates and a second upper pattern in an area excluding the plurality of first upper patterns and the second upper pattern further includes a black pigment. Therefore, the stretchable display device may be deformed more easily to be bent or stretched.

According to another aspect of the present disclosure, a stretchable display device includes a plurality of island substrates which defines a plurality of pixels and is spaced apart from each other, a lower substrate disposed below the plurality of island substrates, an upper substrate, and a connection line which electrically connects pads disposed on adjacent island substrates among the plurality of island substrates, in which the upper substrate is formed of a stretchable polymer material and includes a plurality of first upper patterns overlapping an emission area of the plurality of island substrates and a second upper pattern in an area excluding the plurality of first upper patterns, and a refractive index of the plurality of first upper patterns is larger than a refractive index of the second upper pattern. Therefore, the stretchable display device may be deformed more easily to be bent or stretched without causing the damage of the display element disposed on the plurality of island substrates.

Other detailed matters of the exemplary embodiments are included in the detailed description and the drawings.

According to the present disclosure, individual RGB reflective layers of a micro LED are combined as one layer and a high potential power source line is disposed in a gate line direction to implement a high-resolution micro LED stretchable display device.

According to the present disclosure, a stretchable black polymer material is applied to patterned upper and lower substrates so that the stretchable display device is easily bent or stretched and even though a polarization layer is not disposed, the external reflection of the display device may be effectively reduced.

According to the present disclosure, the polymer material of the patterned lower substrate has different moduli in an emission area and a non-emission area so that the stretchable display device may be easily bent and stretched.

According to the present disclosure, the polymer material of the patterned upper substrate has different refractive indexes in an emission area and a non-emission area so that the stretchable display device may be easily bent and stretched.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENT

Figure 1:
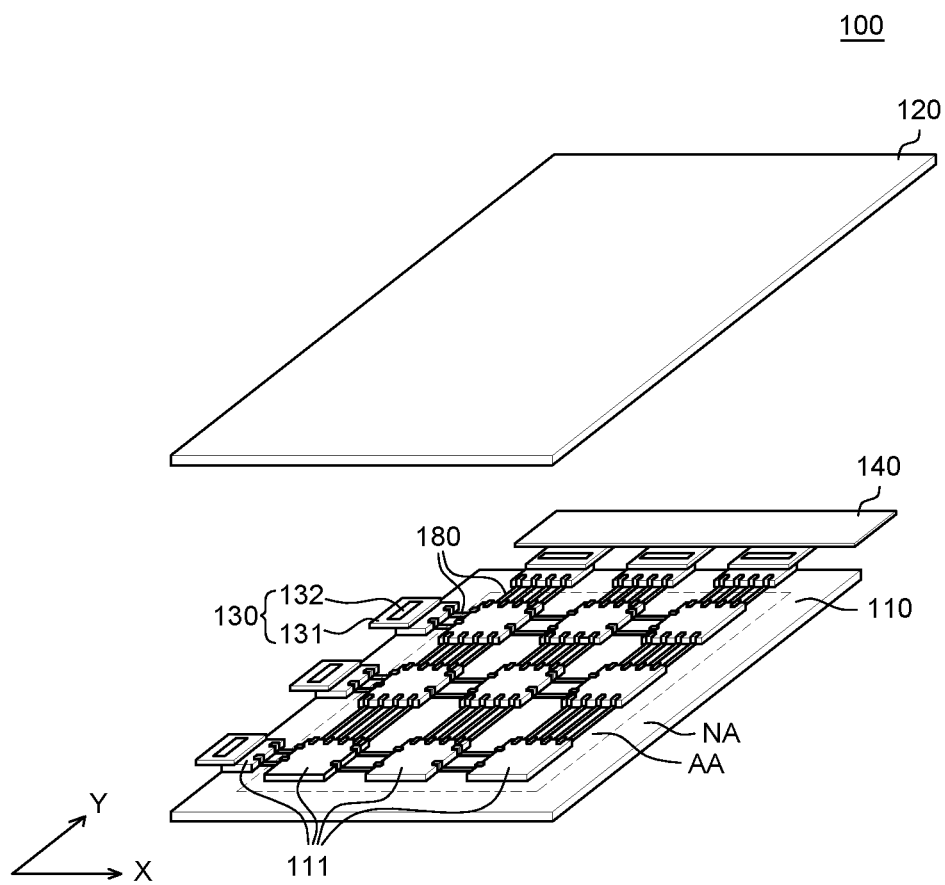
FIG. 1 is a perspective view schematically illustrating a stretchable display device according to a first exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereafter, various embodiments of the present disclosure will be described in detail with reference to the accompanying drawings.

A stretchable display device may be referred to as a display device which is capable of displaying images even though the display device is bent or stretched. The stretchable display device may have a high flexibility as compared with a general display device of the related art. Therefore, a shape of a stretchable display may be freely changed in accordance with manipulation of a user by bending or stretching a stretchable display device by the user. For example, when the user holds ends of the stretchable display device to pull the display device, the stretchable display device may be stretched by the force of the user. Alternatively, when the user disposes the stretchable display device on a wall surface which is not flat, the stretchable display may be disposed to be bent in accordance with the shape of the surface of the wall. Alternatively, when a force applied by the user is removed, the stretchable display device may return to its original shape.

FIG. 1 is a perspective view schematically illustrating a stretchable display device according to a first exemplary embodiment of the present disclosure.

Referring to FIG. 1, the stretchable display device 100 may include a lower substrate 110, a plurality of island substrates 111, a connection line 180, a chip on film (COF) 130, a printed circuit board 140, and an upper substrate 120. The stretchable display device 100 according to the first exemplary embodiment of the present disclosure may further include a polarizer layer on the upper substrate 120, but it is not limited thereto and may not include a polarizer layer.

For the convenience of description, in FIG. 1, an adhesive layer for attaching the lower substrate 110 and the upper substrate 120 is not illustrated.

The lower substrate 110 is a substrate which supports and protects several components of the stretchable display device 100. The lower substrate 110 which is a flexible substrate may be configured by an insulating material which is bendable or stretchable. For example, the lower substrate 110 may be formed of a silicon rubber such as polydimethylsiloxane (PDMS) or an elastomer such as polyurethane (PU). However, the material of the lower substrate 110 is not limited thereto.

The lower substrate 110 is a flexible substrate so as to be reversibly expanded and contracted. Further, an elastic modulus of the lower substrate may be several MPa to several hundreds of MPa and an extension breakage ratio may be 100% or higher. A thickness of the lower substrate 110 may be 10 μm to 1 mm, but is not limited thereto.

The lower substrate 110 may have a display area AA and a non-display area NA enclosing the display area AA.

The display area AA is an area in which an image is displayed in the stretchable display device 100 and a display element and various driving elements for driving the display element are disposed in the display area AA. The display area AA may include a plurality of pixels including a plurality of sub pixels. The plurality of pixel is disposed in the display area AA and includes a plurality of display elements. The plurality of sub pixels may be connected to various wiring lines, respectively. For example, the plurality of sub pixels may be connected to various wiring lines such as a gate line, a data line, a high potential power source line, a low potential power source line, and a reference voltage line.

The non-display area NA is adjacent to the display area AA to enclose the display area AA. In the non-display area NA, no image is displayed and wiring lines or circuit units may be disposed. For example, in the non-display area NA, a plurality of pads is disposed and the pads may be connected to the plurality of sub pixels of the display areas AA, respectively.

The plurality of island substrates 111 may be disposed on the lower substrate 110. The plurality of island substrates 111 is rigid substrates and is spaced apart from each other to be disposed on the lower substrate 110. The plurality of island substrates 111 may be more rigid than the lower substrate 110. That is, the lower substrate 110 may be more flexible than the plurality of island substrates 111 and the plurality of island substrates 111 may be more rigid than the lower substrate 110.

The island substrates 111 may be formed of a plastic material having flexibility. For example, the plurality of island substrates 111 may be formed of polyimide (PI), polyacrylate, and polyacetate. However, the material of the island substrates 111 is not limited thereto.

A modulus of the plurality of island substrates 111 may be higher than a modulus of the lower substrate 110. The modulus is an elastic coefficient which represents a ratio being deformed by a stress with respect to a stress applied to the substrate. The higher the modulus, the higher a degree of hardness. Therefore, the plurality of island substrates 111 may be a plurality of rigid substrates which is more rigid than the lower substrate 110. The moduli of the plurality of island substrates 111 may be 1000 times higher than the modulus of the lower substrate 110, but is not limited thereto.

The connection line 180 may be disposed between the plurality of island substrates 111.

The connection line 180 is disposed between pads disposed on the plurality of islands substrates 111 to electrically connect the pads to each other. The connection line 180 will be described in more detail with reference to FIG. 2.

The COF 130 is a film in which various components are disposed on a flexible base film 131 and supplies signals to the plurality of sub pixels of the display area AA. The COF 130 may be bonded to the plurality of pads disposed in the non-display area NA and supply a power voltage, a data voltage, and a gate voltage to the plurality of sub pixels of the display area AA through the pads. The COF 130 includes a base film 131 and a driving IC 132. Further, various components may be additionally disposed thereon.

The base film 131 is a layer which supports the driving IC 132 of the COF 130. The base film 131 may be formed of an insulating material, for example, may be formed of a flexible insulating material.

The driving IC 132 is a component which processes data for displaying images and a driving signal for processing the data. In FIG. 1, even though it is illustrated that the driving IC 132 is mounted by the COF 130 technique, it is not limited thereto, and the driving IC 132 may be mounted by a technique such as chip on glass (COG) or tape carrier package (TCP).

A control unit such as an IC chip or a circuit unit may be mounted on the printed circuit board 140. Further, on the printed circuit board 140, a memory or a processor may be mounted. The printed circuit board 140 is a component which transmits a signal for driving the display element from the control unit to the display element.

The printed circuit board 140 is connected to the COF 130 to be electrically connected to the plurality of sub pixels of the plurality of island substrates 111.

The upper substrate 120 overlaps the lower substrate 110 to protect various components of the stretchable display device 100. The upper substrate 120 which is a flexible substrate may be configured by an insulating material which is bendable or stretchable. For example, the upper substrate 120 may be formed of a flexible material and formed of the same material as the lower substrate 110, but is not limited thereto.

The polarizer layer is a component which suppresses external reflection of the stretchable display device 100 and overlaps the upper substrate 120 to be disposed above the upper substrate 120. However, the polarizer layer is not limited thereto and may be disposed below the upper substrate 120 or omitted depending on the configuration of the stretchable display device 100.

Hereinafter, the stretchable display device 100 according to the first exemplary embodiment of the present disclosure will be described in more detail with reference to FIGS. 2 to 4.

Figure 2:
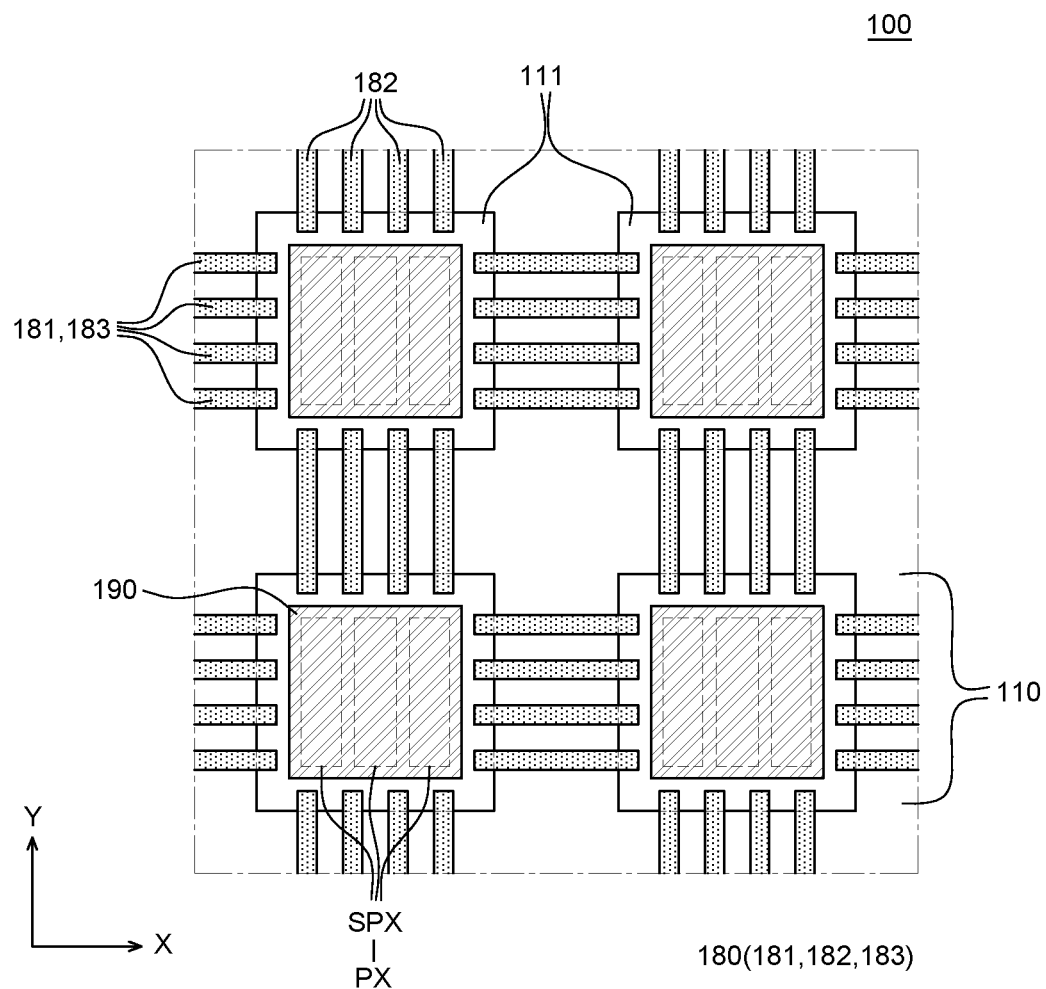
FIG. 2 is an enlarged plan view of a part of a stretchable display device according to a first exemplary embodiment of the present disclosure.

FIG. 2 is an enlarged plan view of a part of a stretchable display device according to a first exemplary embodiment of the present disclosure.

Figure 3:
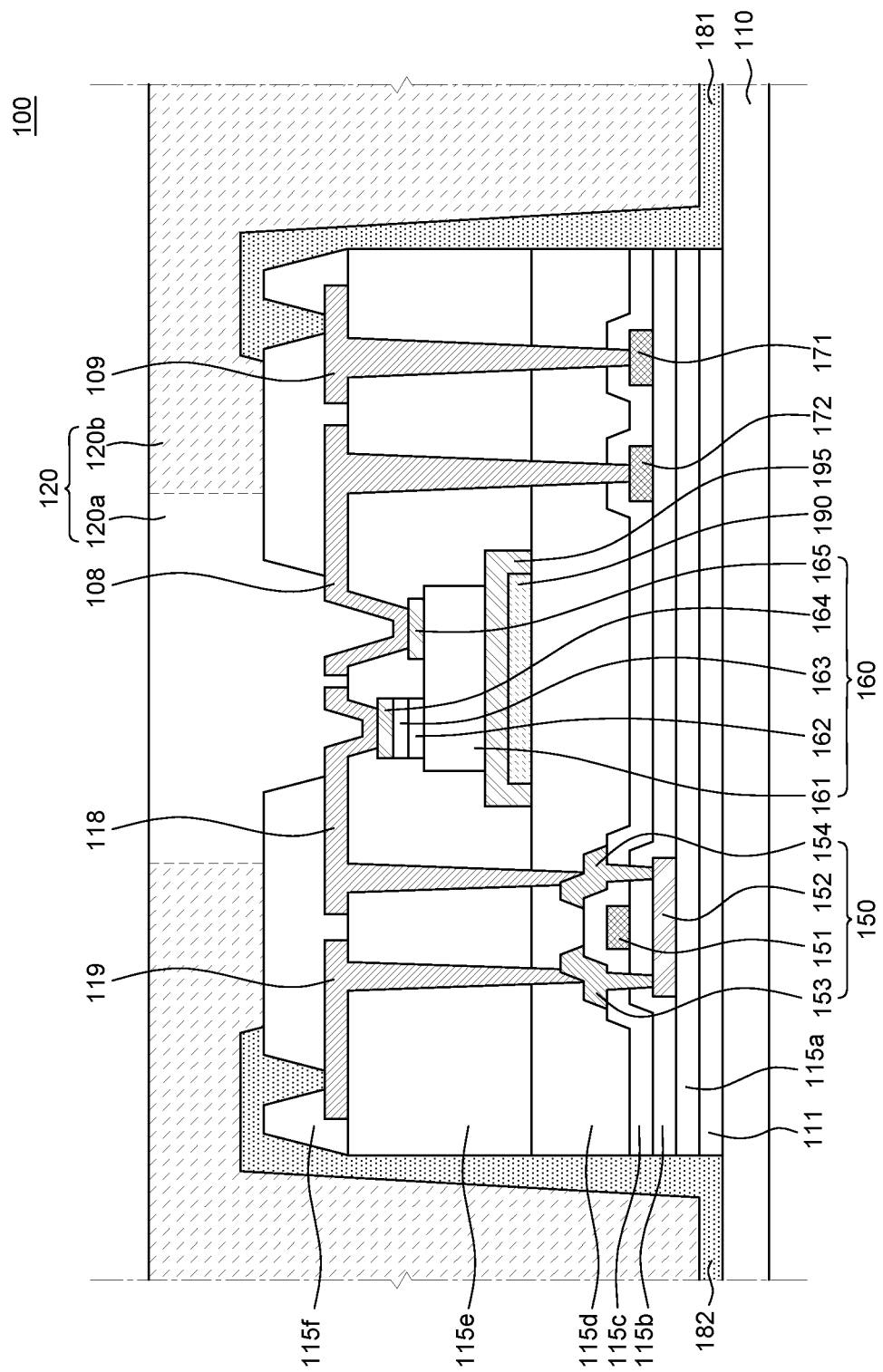
FIG. 3 is a cross-sectional view schematically illustrating one sub pixel of a stretchable display device according to a first exemplary embodiment of the present disclosure.

FIG. 3 is a cross-sectional view schematically illustrating one sub pixel of a stretchable display device according to a first exemplary embodiment of the present disclosure. FIG. 4 is a cross-sectional view schematically illustrating a part of a cross-section of one pixel of a stretchable display device according to a first exemplary embodiment of the present disclosure. For the convenience of description, the description will be made also with reference to FIG. 1.

For the convenience of description, FIG. 3 illustrates a part of a cross-sectional structure for any one sub pixel among a red sub pixel, a green sub pixel, and a blue sub pixel as an example. FIG. 4 illustrates a part of a cross-sectional structure for one pixel including a red sub pixel, a green sub pixel, and a blue sub pixel as an example.

Figure 4:
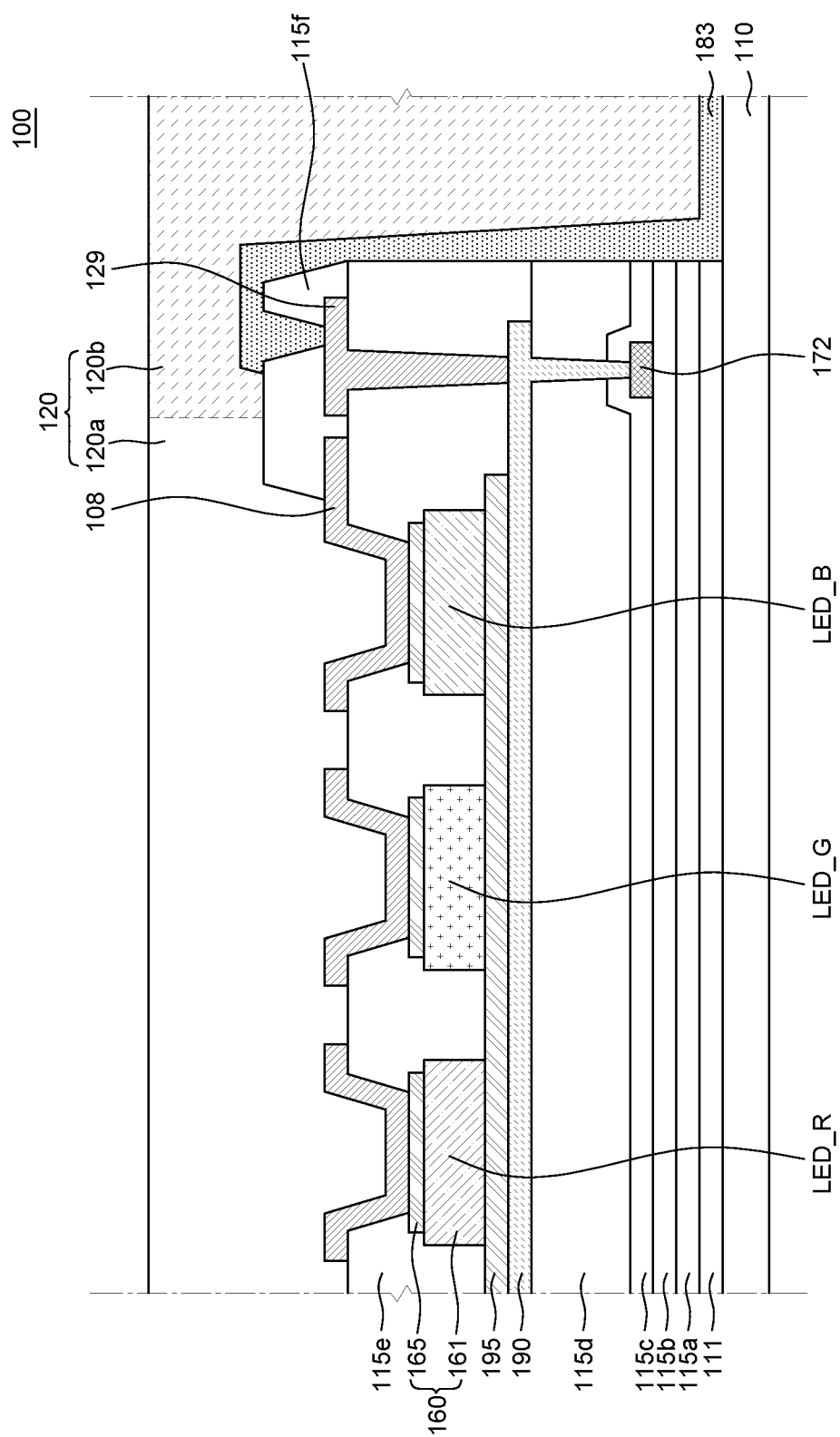
FIG. 4 is a cross-sectional view schematically illustrating a part of a cross-section of one pixel of a stretchable display device according to a first exemplary embodiment of the present disclosure.

In FIG. 4, LED_R, LED_G, and LED_B denote a light emitting diode (LED) of a red sub pixel, an LED of a green sub pixel, and an LED of a blue sub pixel, respectively. In the present disclosure, a micro LED is applied as an LED.

Referring to FIGS. 1 to 4, a plurality of island substrates 111 may be disposed on the lower substrate 110. The plurality of island substrates 111 is spaced apart from each other to be disposed on the lower substrate 110. For example, as illustrated in FIGS. 1 and 2, the plurality of island substrates 111 may be disposed on the lower substrate 110 in a matrix, but is not limited thereto.

Referring to FIGS. 3 and 4, a buffer layer 115a may be disposed on the plurality of island substrates 111. The buffer layer 115a may be formed on the plurality of island substrates 111 to protect various components of the stretchable display device 100 from infiltration of moisture $H_2O$ and oxygen $O_2$ outside the lower substrate 110 and the plurality of island substrates 111. In this case, the buffer layer 115a may be configured of an insulating material and for example, configured by a single layer or a plurality of layers of an inorganic layer formed of silicon nitride (SiNx), silicon oxide (SIOx), and silicon oxynitride (SiON). However, the buffer layer 115a may be omitted depending on a structure or a characteristic of the stretchable display device 100.

The buffer layer 115a may be formed only in an area overlapping the plurality of island substrates 111. As described above, the buffer layer 115a may be formed of an inorganic material so that the buffer layer 115a may be easily cracked or damaged during a process of drawing the stretchable display device 100. Therefore, the buffer layer 115a is not formed in an area between the plurality of island substrates 111, but is patterned to have a shape of the plurality of island substrates 111 to be disposed only above the plurality of island substrates 111. Therefore, in the stretchable display device 100 according to the first exemplary embodiment of the present disclosure, the buffer layer 115a may be formed only in an area overlapping the plurality of island substrates 111 which is rigid substrates. Therefore, even though the stretchable display device 100 is bent or stretched to be deformed, the damage of the buffer layer 115a may be suppressed.

A transistor 150 including an active layer 151, a gate electrode 152, a source electrode 153, and a drain electrode 154 may be formed on the buffer layer 115a.

For example, the active layer 152 may be formed on the buffer layer 115a and the gate insulating layer 115b may be formed between the active layer 152 and the gate electrode 151 to insulate the active layer 152 from the gate electrode 151. Further, an interlayer insulating layer 115c is formed to insulate the gate electrode 151 from the source electrode 153 and the drain electrode 154. The source electrode 153 and the drain electrode 154 which are electrically connected to the active layer 152 may be formed on the interlayer insulating layer 115c.

The gate insulating layer 115b and the interlayer insulating layer 115c are patterned to be formed only in an area overlapping the plurality of island substrates 111. The gate insulating layer 115b and the interlayer insulating layer 115c may also formed of the inorganic material, which is the same as the buffer layer 115a, so that the gate insulating layer 115b and the interlayer insulating layer 115c may also be cracked to be damaged during the process of drawing the stretchable display device 100. Therefore, similarly to the above-described buffer layer 115a, the gate insulating layer 115b and the interlayer insulating layer 115c may not formed in an area between the plurality of island substrates 111, but are patterned to have a shape of the plurality of island substrates 111 to be disposed only above the plurality of island substrates 111. However, the present disclosure is not limited thereto.

In FIG. 3, even though among various transistors which may be included in the stretchable display device 100, only a driving transistor 150 is illustrated for the convenience of description, a switching transistor or a capacitor may also be included in the display device. Further, in the specification, even though it is described that the transistor 150 has a coplanar structure, various transistors such as a staggered transistor may also be used.

The gate line 171 may be disposed on the gate insulating layer 115b. The gate line 171 is a wiring line which transmits a gate signal to the plurality of sub pixels SPX. The gate line 171 may be formed of the same material as the gate electrode 151, but is not limited thereto.

A common line (or a reference voltage line) 172 may be disposed on the gate insulating layer 115b. The common line 172 is a wiring line which applies a common voltage to the plurality of sub pixels SPX. The common line 172 may be formed of the same material as the gate electrode 151 of the transistor 150, but is not limited thereto.

A first planarizing layer 115d may be formed above the transistor 150 and the interlayer insulating layer 115c. The first planarizing layer 115d serves to planarize an upper portion of the transistor 150. The first planarizing layer 115d may be configured by a single layer or a plurality of layers and may be formed of an organic material. For example, the first planarizing layer 115d may be formed of an acrylic organic material, but is not limited thereto.

In some exemplary embodiments, a passivation layer may be formed between the transistor 150/the interlayer insulating layer 115c and the first planarizing layer 115d. That is, the passivation layer may be formed to cover the transistor 150 to protect the transistor 150 from the infiltration of the moisture and oxygen. The passivation layer may be formed of an inorganic material and configured by a single layer or a plurality of layers, but is not limited thereto.

A reflective layer 190 may be disposed on the first planarizing layer 115d.

The reflective layer 190 is a layer which reflects light which is emitted to be directed to the lower substrate 110 among light emitted from the LED 160 onto an upper portion of the stretchable display device 100 to output the light to the outside. The reflective layer 190 may be formed of a metal material having a high reflectivity.

The stretchable display device 100 according to the first exemplary embodiment of the present disclosure combines individual RGB reflective layers as one reflective layer 190. That is, the reflective layer 190 according to the first exemplary embodiment of the present disclosure is not equipped for every sub pixel SPX, but may be integrally configured in one pixel PX formed of RGB sub pixels SPX. Therefore, even though the rigid area is reduced, a high-resolution stretchable display device 100 may be implemented using the existing micro LED. That is, there may be a minimum required area of the LED chip in the rigid area and for example, at a high-resolution of 120 ppi, it may be difficult to transfer the LED chips in the rigid area. Therefore, in the present disclosure, a cohesion margin of the transferring process is realized and the individual RGB reflective layers are integrated into one reflective layer 190 so that a minimum separation distance of approximately 4 μm (2 μm+2 μm) for patterning the individual RGB reflective layers may be removed.

Further, the stretchable display device 100 according to the first exemplary embodiment of the present disclosure may use the reflective layer 190 as a common electrode and may be electrically connected to the common line 172 below the reflective layer 190 through a contact hole.

Even though not illustrated in the drawing, a storage electrode is configured below the reflective layer 190 to configure a large-scale storage capacitor.

An adhesive layer 195 may be disposed on the reflective layer 190 to cover the reflective layer 190.

The adhesive layer 195 is a layer for adhering the LED 160 onto the reflective layer 190 and also insulates the reflective layer 190 formed of a metal material from the LED 160. The adhesive layer 195 may be formed of a thermosetting material or a photo curable material, but the present disclosure is not limited thereto.

The LED 160 may be disposed on the adhesive layer 195. The LED 160 may be disposed to overlap the reflective layer 190. The RGB LED 160 may be disposed on one reflective layer 190.

The LED 160 may include an n-type layer 161, an active layer 162, a p-type layer 163, an n electrode 165, and a p electrode 164. Hereinafter, it is described that a lateral LED 160 is used as the LED 160, but the structure of the LED 160 is not limited thereto.

Specifically, the n-type layer 161 of the LED 160 may be disposed on the adhesive layer 195 to overlap the reflective layer 190. The n-type layer 161 may be formed by injecting an n-type impurity into gallium nitride having excellent crystallinity. The active layer 162 may be disposed on the n-type layer 161. The active layer 162 is a light emitting layer which emits light in the LED 160 and may be formed of a nitride semiconductor, for example, indium gallium nitride. The p-type layer 163 may be disposed on the active layer 162. The p-type layer 163 may be formed by injecting a p-type impurity into gallium nitride. However, constitution materials of the n-type layer 161, the active layer 162, and the p-type layer 163 are not limited thereto.

The p electrode 164 may be disposed on the p-type layer 163 of the LED 160. The n electrode 165 may be disposed on the n-type layer 161 of the LED 160. The n electrode 165 may be disposed to be spaced apart from the p electrode 164. Specifically, on the LED 160, the n-type layer 161, the active layer 162, and the p-type layer 163 are sequentially laminated and after partially etching the active layer 162 and the p-type layer 163, the n electrode 165 and the p electrode 164 are formed. In this case, a predetermined part is a space for separating the n electrode 165 and the p electrode 164 from each other and the predetermined part may be etched to expose a part of the n-type layer 161. That is, the surfaces of the LED 160 to dispose the n electrode 165 and the p electrode 164 are not flat surfaces and have different heights. Therefore, the p electrode 164 is disposed on the p-type layer 163 and the n electrode 165 is disposed on the n-type layer 161, and the p electrode 164 and the n electrode 165 are disposed at different levels to be spaced apart from each other. Therefore, the n electrode 165 may be disposed to be closer to the reflective layer 190 than the p electrode 164. The n electrode 165 and the p electrode 164 may be formed of a conductive material and for example, formed of a transparent conductive oxide. Further, the n electrode 165 and the p electrode 164 may be formed of the same material, but are not limited thereto.

A second planarizing layer 115e may be disposed above the first planarizing layer 115d and the adhesive layer 195. The second planarizing layer 115e is a layer which planarizes an upper surface of the LED 160. The second planarizing layer 115e may be disposed in an area excluding an area where the LED 160 is disposed to planarize the upper surface of the second planarizing layer 115e. In this case, the second planarizing layer 115e may be configured by two or more layers.

A first electrode 118 and a second electrode 108 may be disposed on the second planarizing layer 115e.

The first electrode 118 is an electrode which electrically connects the transistor 150 and the LED 160. Specifically, the first electrode 118 may be connected to the p electrode 164 of the LED 160 through a contact hole formed in the second planarizing layer 115e. Further, the first electrode 118 may be connected to the drain electrode 154 of the transistor 150 through contact holes formed in the first and second planarizing layers 115d and 115e. However, the first electrode 118 is not limited thereto, but may be connected to the source electrode 153 of the transistor 150 depending on the type of the transistor 150. The p electrode 164 of the LED 160 and the drain electrode 154 of the transistor 150 may be electrically connected to each other by the first electrode 118.

The second electrode 108 is an electrode which electrically connects the LED 160 and the common line 172. Specifically, the second electrode 108 may be connected to the common electrode 172 through contact holes formed in the first and second planarizing layers 115d and 115e. Further, the second electrode 108 may be connected to the n electrode 165 of the LED 160 through a contact hole formed in the second planarizing layer 115e. Therefore, the common electrode 172 and the n electrode 165 of the LED 160 may be electrically connected to each other.

In the meantime, a gate pad 109, a high potential power pad 119, and a connection pad 129 may be disposed on the second planarizing layer 115e.

The gate pad 109 may transmit a gate signal applied from the first connection line 181 to the plurality of sub pixels SPX through the gate line 171. The gate pad 109 is connected to the gate line 171 through the contact holes formed in the first and second planarizing layers 115d and 115e and the interlayer insulating layer 115c and transmits the gate signal to the gate line 171. The gate pad 109 may be formed of the same material as the first electrode 118 and the second electrode 108, but is not limited thereto. Further, the gate pad 109 may be formed on the first planarizing layer 115d or the interlayer insulating layer 115c, rather than the second planarizing layer 115e, to be formed of a separate material or the same material as the source electrode 153 and the drain electrode 154 of the transistor 150.

The high potential power pad 119 is applied with a high potential power voltage from a second connection line 182 to transmit the high potential power voltage to the plurality of sub pixels SPX through a high potential power source line (not illustrated). In the meantime, the high potential power pad 119 may be connected to the source electrode 153 of the transistor 150 through contact holes formed in the first and second planarizing layers 115d and 115e and the interlayer insulating layer 115c. The high potential power pad 119 may be formed of the same material as the first electrode 118 and the second electrode 108, but is not limited thereto. Further, the high potential power pad 119 may be formed on the first planarizing layer 115d or the interlayer insulating layer 115c, rather than the second planarizing layer 115e to be formed of a separate material or the same material as the source electrode 153 and the drain electrode 154 of the transistor 150.

The connection pad 129 may transmit a common voltage (or a reference power source voltage) applied from a third connection line 183 to the plurality of sub pixels SPX through the common line 172. Specifically, the connection pad 129 is connected to the reflective layer 190 through the contact hole formed in the second planarizing layer 115e. The reflective layer 190 is connected to the common line 172 through the contact holes formed in the first planarizing layer 115d and the interlayer insulating layer 115c and transmits the common voltage to the second electrode 108. The connection pad 129 may be formed of the same material as the first electrode 118 and the second electrode 108, but is not limited thereto. Further, the connection pad 129 may be formed on the first planarizing layer 115d, rather than the second planarizing layer 115e, to be formed of a separate material.

Even though not illustrated in the drawing, the data pad transmits a data signal applied from the connection line to the plurality of sub pixels SPX through the data line. The data pad may be connected to the source electrode of the switching transistor through the contact holes formed in the first and second planarizing layers 115d and 115e and the interlayer insulating layer 115c. The data pad may be formed of the same material as the first electrode 118 and the second electrode 108, but is not limited thereto. Further, the data pad may be formed on the first planarizing layer 115d or the interlayer insulating layer 115c, rather than the second planarizing layer 115e, to be formed of a separate material or the same material as the source electrode 153 and the drain electrode 154 of the transistor 150.

A bank 115f may be formed on the first electrode 118, the second electrode 108, the gate pad 109, the high potential power pad 119, and the connection pad 129. The bank 115f is a component which divides adjacent sub pixels SPX. The bank 115f is disposed to partially cover the first electrode 118 and the second electrode 108 adjacent to each other to expose parts of upper surfaces of the first electrode 118 and the second electrode 108. The bank 115f may be formed of acrylic resin, benzocyclobutene (BCB) resin, or polyimide, but is not limited thereto. In the meantime, a black bank 115f may be applied to block rear external light transmission.

The bank 115f may include a contact hole which connects the first connection line 181 and the gate pad 109, a contact hole which connects the second connection line 182 and the high potential power pad 119, and a contact hole which connects the third connection line 183 and the connection pad 129.

When the stretchable display device 100 according to the first exemplary embodiment of the present disclosure is compared with a normal display device of the related art, the stretchable display device 100 has a structure in which the plurality of island substrates 111 relatively having a rigidity is spaced apart from each other to be disposed on the lower substrate 110 relatively having a flexibility. That is, in the stretchable display device 100 according to the first exemplary embodiment of the present disclosure, when the user stretches or bends the stretchable display device 100, the stretchable display device 100 is more easily deformed. Further, when the stretchable display device 100 is deformed, the damages of components of the stretchable display device 100 may be minimized.

The connection line 180 refers to a wiring line which electrically connects pads on the plurality of island substrates 111 to each other. The connection line 180 may include a first connection line 181, a second connection line 182, and a third connection line 183. The first connection line 181 and the third connection line 183 refer to wiring lines extending in an X-axis direction among the connection lines 180 and the second connection line 182 refers to a wiring line extending in an Y-axis direction among the connection lines 180.

In the meantime, in the display area AA, the connection line 180 may be formed on the bank 115f, but is not limited thereto and may be formed on the first planarizing layer 115d.

In the case of a general display device, various wiring lines such as a plurality of gate lines and a plurality of data lines extend between the plurality of sub pixels and a plurality of sub pixels is connected to one signal line. Therefore, in the general display device, various wiring lines such as a gate line, a data line, a high potential power source line, and a reference voltage line extend from one side to the other side of the display device without being disconnected on the substrate.

In contrast, in the stretchable display device 100 according to the first exemplary embodiment of the present disclosure, various wiring lines such as the gate line 171, the data line, the high potential power source line, and the common line 172 formed of a metal material may be disposed only above the plurality of island substrates 111. That is, in the stretchable display device 100 according to the first exemplary embodiment of the present disclosure, various wiring lines formed of a metal material are disposed only above the plurality of island substrates 111, but may be formed so as not to be in contact with the lower substrate 110. Therefore, various wiring lines may be patterned so as to correspond to the plurality of island substrates 111 to be discontinuously disposed.

In the display device 100 according to the first exemplary embodiment of the present disclosure, in order to connect the discontinuous wiring lines, pads on two adjacent island substrates 111 may be connected by the connection line 180. That is, the connection line 180 may electrically connect pads above two adjacent island substrates 111. Therefore, the stretchable display device 100 of the present disclosure may include a plurality of connection lines 180 to electrically connect various wiring lines such as the gate line 171, the data line, the high potential power source line, and the common line 172 to each other between the plurality of island substrates 111. For example, the gate line 171 is disposed above the plurality of island substrates 111 disposed to be adjacent to each other in an X-axis direction and the gate pad 109 may be disposed on both ends of the gate line 171. In this case, the plurality of gate pads 109 above the plurality of island substrates 111 adjacent to each other in the X-axis direction may be connected to each other by the first connection line 181. Therefore, the gate line 171 disposed above the plurality of island substrates 111 and the first connection line 181 disposed on the lower substrate 110 may serve as one gate line. Further, the common line 172 is disposed above the plurality of island substrates 111 adjacent to each other in the X-axis direction and the connection pad 129 may be disposed on both ends of the common line 172. In this case, the plurality of connection pads 129 above the plurality of island substrates 111 adjacent to each other in the X-axis direction may be connected to each other by the third connection line 183. Therefore, the common line 172 disposed above the plurality of island substrates 111 and the third connection line 183 disposed on the lower substrate 110 may serve as one common line. Further, even though not illustrated in the drawings, the high potential power source line may be disposed above the plurality of island substrates 111 adjacent to each other in the Y-axis direction and the high potential power pad 119 may be disposed on both ends of the high potential power source line. In this case, the plurality of high potential power pads 119 above the plurality of island substrates 111 adjacent to each other in the Y-axis direction may be connected to each other by the second connection line 182. Therefore, the high potential power source line disposed above the plurality of island substrates 111 and the second connection line 182 disposed on the lower substrate 110 may serve as one high potential power source line. Further, even though not illustrated in the drawing, the data line may be disposed above the plurality of island substrates 111 adjacent to each other in the Y-axis direction and the data pad may be disposed on both ends of the data line. In this case, the plurality of data pads 109 above the plurality of island substrates 111 adjacent to each other in the Y-axis direction may be connected to each other by the connection line 180. Therefore, the data line disposed above the plurality of island substrates 111 and the connection line 180 disposed on the lower substrate 110 may serve as one data line.

As described above, in the stretchable display device 100 according to the first exemplary embodiment of the present disclosure, not only the gate line 171, but also the common line 172 are disposed in the X-axis direction so that a separation space between the sub pixels SPX is reduced in the X-axis direction. Therefore, even though the rigid area is reduced, the high-resolution stretchable display device 100 may be implemented.

In the meantime, referring to FIG. 2, the first connection line 181 and the third connection line 183 may connect pads above two island substrates 111 which are disposed in parallel, among pads above the plurality of island substrates 111 adjacent to each other in the X-axis direction. The first connection line 181 may serve as a gate line or a high potential power source line, but is not limited thereto. For example, the first connection line 181 may serve as a gate line and electrically connect gate pads 109 above two island substrates 111 disposed in parallel in the X-axis direction, through the contact hole formed in the bank 115f. Therefore, as described above, the gate pads 109 above the plurality of island substrates 111 disposed in the X-axis direction may be connected by the first connection line 181 serving as a gate line and transmit one gate signal.

Further, the third connection line 183 may serve as a common line and electrically connect connection pads 129 above two island substrates 111 disposed in parallel in the X-axis direction, through the contact hole formed in the bank 115f. Therefore, as described above, the connection pads 129 above the plurality of island substrates 111 disposed in the X-axis direction may be connected by the third connection line 183 serving as a common line and transmit one common voltage.

Referring to FIG. 2, the second connection line 182 may connect pads above two island substrates 111 which are disposed in parallel, among pads above the plurality of island substrates 111 adjacent to each other in the Y-axis direction. The second connection line 182 may serve as a data line, but is not limited thereto. For example, the second connection line 182 may serve as a data line and electrically connect data pads above two island substrates 111 disposed in parallel in the Y-axis direction, through the contact hole formed in the bank 115f. Therefore, as described above, the data pads above the plurality of island substrates 111 disposed in the Y-axis direction may be connected by the plurality of second connection line 182 serving as a data line and transmit one data signal.

Referring to FIG. 2, the connection line 180 may include base polymer and conductive particles. Specifically, the first connection line 181 includes base polymer and conductive particles, the second connection line 182 includes base polymer and conductive particles, and the third connection line 183 includes base polymer and conductive particles.

The first connection line 181 may be formed to extend to an upper surface of the lower substrate 110 while being in contact with an upper surface and a side surface of the bank 115f disposed above the island substrate 111, and side surfaces of the first and second planarizing layers 115d and 115e, the interlayer insulating layer 115c, the gate insulating layer 115b, the buffer layer 115a, and the plurality of island substrates 111. Therefore, the first connection line 181 is in contact with the upper surface of the lower substrate 110, is in contact with the side surfaces of the adjacent island substrates 111, and is in contact with the side surfaces of the buffer layer 115a, the gate insulating layer 115b, the interlayer insulating layer 115c, the first and second planarizing layers 115d and 115e, and the bank 115f disposed above the adjacent island substrates 111. Further, the first connection line 181 may be in contact with the gate pads 109 disposed in the adjacent island substrates 111, but is not limited thereto.

Further, the base polymer of the first connection line 181 may be configured by a bendable or stretchable insulating material, similarly to the lower substrate 110. The base polymer may include styrene butadiene styrene (SBS), but is not limited thereto. Therefore, when the stretchable display device 100 is bent or stretched, the base polymer may not be damaged. The base polymer may be formed by coating an upper portion of the lower substrate 110 or the island substrate 111 with a material which configures the base polymer or applying the material which configures the base polymer using a slit.

The conductive particles of the first connection line 181 may be dispersed in the base polymer. Specifically, the first connection line 181 may include conductive particles which are dispersed in the base polymer at a predetermined concentration. For example, the first connection line 181 may be formed by uniformly agitating the conductive particles in the base polymer and then coating and curing the base polymer in which the conductive particles are dispersed, above the lower substrate 110 and the island substrate 111, but is not limited thereto. The conductive particles may include at least one of silver (Ag), gold (Au), and carbon, but are not limited thereto.

The conductive particles dispersed in the base polymer of the first connection line 181 may form a conductive path which electrically connects the gate pads 109 disposed on the island substrates 111 adjacent to each other. Further, a gate pad 109 disposed on an island substrate 111 disposed at an outermost edge among the plurality of island substrates 111 and the pad disposed in the non-display area NA are electrically connected to form a conductive path. Referring to FIG. 2, the base polymer of the first connection line 181 and the conductive particles dispersed in the base polymer may linearly connect the pads disposed on the island substrates 111 adjacent to each other. To this end, during the manufacturing process, the base polymer may be formed to have a linear shape which connects the pads disposed on the plurality of island substrates 111. Therefore, the conductive path formed by the conductive particles dispersed in the base polymer may also have a linear shape. However, the process of forming the base polymer and the conductive particles of the first connection line 181 and the shape thereof are not limited thereto.

The second connection line 182 may be formed to extend to an upper surface of the lower substrate 110 while being in contact with an upper surface and a side surface of the bank 115f disposed above the island substrate 111, side surfaces of the first and second planarizing layers 115d and 115e, the interlayer insulating layer 115c, the gate insulating layer 115*b*, the buffer layer 115*a*, and the plurality of island substrates 111. Therefore, the second connection line 182 is in contact with the upper surface of the lower substrate 110, is in contact with the side surfaces of the adjacent island substrates 111, and is in contact with the side surfaces of the buffer layer 115*a*, the gate insulating layer 115*b*, the interlayer insulating layer 115*c*, the first and second planarizing layers 115*d* and 115*e*, and the bank 115*f* disposed above the adjacent island substrates 111. Further, the second connection line 182 may be in contact with the high potential power pad 119 disposed in the adjacent island substrates 111, but is not limited thereto.

Similarly to the lower substrate 110, the base polymer of the second connection line 182 may be configured of a bendable or stretchable insulating material and may be the same material as the base polymer of the first connection line 181. That is, the base polymer may include styrene butadiene styrene (SBS), but is not limited thereto.

The conductive particles of the second connection line 182 may be dispersed in the base polymer. Specifically, the second connection line 182 may include conductive particles which are dispersed in the base polymer at a predetermined concentration. In this case, the concentration of the conductive particles dispersed in the upper portion of the base polymer of the second connection line 182 may be substantially the same as the concentration of the conductive particles dispersed in the lower portion of the base polymer. Further, the manufacturing process of the second connection line 182 may be the same as the manufacturing process of the first connection line 181 and the manufacturing processes may be simultaneously performed.

The conductive particles dispersed in the base polymer of the second connection line 182 may form a conductive path which electrically connects the high potential power pads 119 disposed on the island substrates 111 adjacent to each other. The high potential power pad 119 disposed on an island substrate 111 disposed at an outermost edge among the plurality of island substrates 111 and the pad disposed in the non-display area NA are electrically connected to form a conductive path.

Referring to FIG. 2, the base polymer of the second connection line 182 and the conductive particles dispersed in the base polymer may linearly connect the pads disposed on the adjacent island substrates 111. To this end, during the manufacturing process, the base polymer may be formed to have a linear shape which connects the pads disposed on the plurality of island substrates 111. Therefore, the conductive path formed by the conductive particles dispersed in the base polymer may also have a linear shape. However, the process of forming the base polymer and the conductive particles of the second connection line 182 and the shape thereof are not limited thereto.

The third connection line 183 may be formed to extend to an upper surface of the lower substrate 110 while being in contact with an upper surface and a side surface of the bank 115*f* disposed above the island substrate 111, and side surfaces of the first and second planarizing layers 115*d* and 115*e*, the interlayer insulating layer 115*c*, the gate insulating layer 115*b*, the buffer layer 115*a*, and the plurality of island substrates 111. Therefore, the third connection line 183 is in contact with the upper surface of the lower substrate 110, is in contact with the side surfaces of the adjacent island substrates 111, and side surfaces of the buffer layer 115*a*, the gate insulating layer 115*b*, the interlayer insulating layer 115*c*, the first and second planarizing layers 115*d* and 115*e*, and the bank 115*f* disposed above the adjacent island substrates 111. Further, the third connection line 183 may be in contact with the connection pad 129 disposed in the adjacent island substrates 111, but is not limited thereto.

Similarly to the lower substrate 110, the base polymer of the third connection line 183 may be configured of a bendable or stretchable insulating material and may be the same material as the base polymers of the first connection line 181 and the second connection line 182. That is, the base polymer may include styrene butadiene styrene (SBS), but is not limited thereto.

The conductive particles of the third connection line 183 may be dispersed in the base polymer. Specifically, the third connection line 183 may include conductive particles which are dispersed in the base polymer at a predetermined concentration. In this case, the concentration of the conductive particles dispersed in the upper portion of the base polymer of the third connection line 183 may be substantially the same as the concentration of the conductive particles dispersed in the lower portion of the base polymer. Further, the manufacturing process of the third connection line 183 may be the same as the manufacturing process of the first connection line 181 and the second connection line 182 and the manufacturing processes may be simultaneously performed.

The conductive particles dispersed in the base polymer of the third connection line 183 may form a conductive path which electrically connects the connection pads 129 disposed on the island substrates 111 adjacent to each other. The connection pad 129 disposed on an island substrate 111 disposed at an outermost edge among the plurality of island substrates 111 and the pad disposed in the non-display area NA are electrically connected to form a conductive path.

Referring to FIG. 2, the base polymer of the third connection line 183 and the conductive particles dispersed in the base polymer may linearly connect the pads disposed on the adjacent island substrates 111. To this end, during the manufacturing process, the base polymer may be formed to have a linear shape which connects the pads disposed on the plurality of island substrates 111. Therefore, the conductive path formed by the conductive particles dispersed in the base polymer may also have a linear shape. However, the process of forming the base polymer and the conductive particles of the third connection line 183 and the shape thereof are not limited thereto.

In some exemplary embodiments, the conductive particles dispersed in the base polymer of the connection line 180 may be dispersed in the base polymer with a concentration gradient. The concentration of the conductive particles is reduced from the upper portion of the base polymer to the lower portion and thus, the conductivity by the conductive particles may be the largest in the upper portion of the base polymer. Specifically, the conductive particles may be injected into the base polymer using an ink printing process which uses a conductive precursor to be dispersed on an upper surface of the base polymer. During the process of injecting the conductive particles in the base polymer, the polymer is swelled several times so that the conductive particles may be infiltrated into an empty space of the base polymer. Thereafter, when the base polymer in which the conductive particles are injected is dipped in a predetermined reducing material or is reduced using a vapor, the connection line 180 may be formed. Therefore, in an infiltration area above the base polymer, a concentration of the conductive particles may be high enough to form the conductive path. A thickness of the infiltration area where the conductive particles are dispersed in the upper portion of the base polymer at a high concentration may vary depending on a time when the conductive particles are injected onto the upper surface of the base polymer and the strength. For example, the more the time or the strength that the conductive particles are injected onto the upper surface of the base polymer, the larger the thickness of the infiltration area. Further, the conductive particles may be in contact with each other in the upper portion of the base polymer so that the conductive path is formed by the conductive particles which are in contact with each other to transmit an electrical signal.

Further, in some exemplary embodiments, the base polymer of the connection line 180 may be formed above the lower substrate 110 between the adjacent island substrates 111 as a single layer. Specifically, unlike that illustrated in FIG. 2, the base polymer may be disposed to be in contact with the lower substrate 110 in an area between the island substrates 111 which are the most adjacent to each other in the X-axis direction as a single layer. The base polymer may be formed to overlap all the plurality of pads formed in parallel on one upper side of one island substrate 111. The conductive particles may be formed individually so as to correspond to the plurality of pads while forming a plurality of conductive paths on the base polymer disposed as one layer. Therefore, the conductive path formed by the conductive particles may linearly connect the pads disposed on the island substrates 111 which are adjacent to each other. For example, the conductive particles may be injected on the upper surface of the base polymer disposed between the plurality of island substrates 111 as one layer to form four conductive paths.

Further, in some exemplary embodiments, the base polymer of the connection line 180 may be disposed in an entire area excluding an area where the plurality of island substrates 111 is disposed. The base polymer may be disposed as one layer to be in contact with the lower substrate 110 in an area of the lower substrate 110 excluding an area which overlaps a plurality of rigid substrates, that is, the plurality of island substrates 111. Therefore, the area of the lower substrate 110 excluding the area which overlaps the plurality of island substrates 111 may be covered by the base polymer. The base polymer may be in contact with the pads of the plurality of island substrates 111 so that a part of the base polymer may be disposed so as to cover the edge of the plurality of island substrates 111. The conductive particles may form a conductive path which connects pads above the plurality of island substrates 111 adjacent to each other above the base polymer.

When the base polymer is disposed as a single layer in an entire area excluding the area where the plurality of island substrates 111 is disposed above the lower substrate 110, the base polymer may be formed to apply the entire area of the lower substrate 110 excluding an area where the plurality of island substrates 111 is disposed. Therefore, a separate process of patterning the base polymer may not be necessary. Therefore, the manufacturing process of the base polymer and the connection line may be simplified, and the process cost and time may be reduced.

Further, since the base polymer is disposed as a single layer in the entire area excluding an area where the plurality of island substrates 111 is disposed above the lower substrate 110, a force applied when the stretchable display device 100 is bent or stretched may be dispersed. Further, in some exemplary embodiments, the upper surface of the base polymer of the connection line 180 may be flat. Specifically, unlike that illustrated in FIGS. 3 and 4, the upper surface of the base polymer of the connection line 180 may be higher than an upper surface of the second planarizing layer 115e above the plurality of island substrates 111. Further, the upper surface of the base polymer may be higher than the upper surface of the bank 115f above the plurality of island substrates 111. Therefore, in the base polymer of the connection line 180, a height of an upper surface of a portion overlapping the plurality of island substrates 111 may be equal to a height of an upper portion of an area disposed between the plurality of island substrates 111. Therefore, the upper surface of the connection line 180 may be flat. Accordingly, the upper surfaces of the conductive particles dispersed above the base polymer may have a linear shape without having a curvature on the cross-section view.

There may be a step between the upper surface of the bank 115f and the upper surface of the lower substrate 110 due to various components above the plurality of island substrates 111 which is disposed to be spaced apart from each other above the lower substrate 110. In this case, the base polymer may be cut off by the step of the upper surface of the base polymer so that an electrical path between the pads disposed in the adjacent island substrates 111 may be blocked and a defective rate of the stretchable display device may be increased.

In this case, when the upper surface of the base polymer is flat, a step between the upper surface of the elements disposed on the plurality of island substrates 111 and the upper surface of the lower substrate 110 on which the plurality of island substrates 111 is not disposed may be removed. Therefore, even though the stretchable display device 100 is bent or stretched, the cut-off of the connection line 180 including the base polymer and the conductive particles due to the step may be avoided.

Referring to FIGS. 3 to 4 again, the upper substrate 120 may be disposed above the lower substrate 110.

The upper substrate 120 is a substrate which supports various components disposed below the upper substrate 120. The upper substrate 120 which is a flexible substrate may be configured by an insulating material which is bendable or stretchable. The upper substrate 120 is a flexible substrate so as to be reversibly expanded and contracted. Further, an elastic modulus of the upper substrate may be several MPa to several hundreds of MPa and an extension breakage ratio may be 100% or higher. A thickness of the upper substrate 120 may be 10 µm to 1 mm, but is not limited thereto.

The upper substrate 120 may be formed of the same material as the lower substrate 110 and for example, may be formed of a silicon rubber such as polydimethylsiloxane (PDMS) or an elastomer such as polyurethane (PU). Therefore, the upper substrate 120 may have a flexible property. However, the material of the upper substrate 120 is not limited thereto.

A pressure is applied to the upper substrate 120 and the lower substrate 110 so that the upper substrate 120 and the lower substrate 110 may be bonded by an adhesive layer disposed below the upper substrate 120. However, the present disclosure is not limited thereto, and the adhesive layer may be omitted in some exemplary embodiments.

The stretchable display device needs to have a property which is easily bendable and stretchable, so that there is an attempt to use a substrate which has a small modulus to have a flexible property. However, when a flexible material such as polydimethylsiloxane (PDMS) having a small modulus is used as a lower substrate to be disposed while manufacturing a display element, there is a problem in that the substrate is damaged due to a high temperature generated during the process of forming a transistor and a display element, for example, a temperature of 100° C. or higher due to a characteristic of the material having a small modulus which is vulnerable to the heat.

Therefore, it is possible to suppress the damage of the substrate during the process of forming a display element by forming the display element above a substrate formed of a material which is tolerable to the high temperature. Therefore, there is an attempt to form the substrate using a material which is tolerable to the high temperature generated during the manufacturing process, such as polyimide (PI). However, since the materials which are tolerable to the high temperature have a large modulus, there is a problem in that the materials do not have a flexible property so that the substrate is hardly bent or stretched during the process of drawing the stretchable display device.

Therefore, in the stretchable display device 100 according to the first exemplary embodiment of the present disclosure, the plurality of island substrates 111 formed of a rigid material is disposed only in an area where the transistor 150 or the LED 160 is disposed. Therefore, the damage of the plurality of island substrates 111 due to the high temperature during the manufacturing process of the transistor 150 or the LED 160 may be avoided.

Further, in the stretchable display device 100 according to the first exemplary embodiment of the present disclosure, the lower substrate 110 and the upper substrate 120 which are flexible substrates may be disposed below and above the plurality of island substrates 111. Therefore, the remaining area of the lower substrate 110 and the upper substrate 120 excluding the area overlapping the plurality of island substrates 111 may be easily stretched and bent, so that the stretchable display device 100 may be implemented. Further, the transistor 150 and the LED 160 disposed above the plurality of island substrates 111 which is rigid substrates may be suppressed from being damaged as the stretchable display device 100 is bent or stretched.

In the meantime, when the stretchable display device is bent or stretched, the lower substrate which is formed of a flexible substrate is deformed, but the island substrates which are formed of a rigid substrate with LEDs disposed thereon may not be deformed. In this case, when the wiring line which connects the pads disposed on the plurality of island substrates is not formed of a material which is easily bent or stretched, the wiring line may be easily cracked due to the deformation of the lower substrate to be damaged.

In contrast, in the stretchable display device 100 according to the first exemplary embodiment of the present disclosure, the pads disposed in the plurality of island substrates 111 may be electrically connected by the connection line 180 including the base polymer and the conductive particles. The base polymer has a flexibility which allows the base polymer to be easily deformed. Therefore, even though the stretchable display device 100 according to the first exemplary embodiment of the present disclosure is bent or stretched to be deformed, the area between the plurality of island substrates 111 of the connection line 180 including the base polymer may be easily deformed.

Further, in the stretchable display device 100 according to the first exemplary embodiment of the present disclosure, the connection line 180 includes the conductive particles so that damages such as cracks may not be caused in the conductive path formed by the conductive particles even though the base polymer is deformed. For example, when the stretchable display device 100 is bent or stretched to be deformed, the lower substrate 110 which is a flexible substrate may be deformed in the remaining area excluding an area where the plurality of island substrates 111 which are rigid substrates is disposed. In this case, the distance between the plurality of conductive particles disposed above the lower substrate 110 which is deformed may be changed.

In this case, the concentration of the plurality of conductive particles which are disposed above the base polymer to form the conductive path may be maintained to be high so that even though the distance between the plurality of conductive particles is increased, the electrical signal may be transmitted. Therefore, even though the base polymer is bent or stretched, the conductive path by the plurality of conductive particles may smoothly transmit the electrical signal. Further, even though the stretchable display device 100 is bent or stretched to be deformed, the electrical signal may be transmitted between the pads.

In the stretchable display device 100 according to the first exemplary embodiment of the present disclosure, the connection line 180 includes the base polymer and the conductive particles. Therefore, the connection line 180 which connects the pads disposed on the plurality of island substrates 111 adjacent to each other may be formed to have a shortest distance, that is, disposed to have a linear shape. That is, even though the connection 180 is not formed to have a curved shape, the stretchable display device 100 may be implemented. The conductive particles of the connection line 180 are dispersed in the base polymer to form the conductive path. Further, as the stretchable display device 100 is bent or stretched to be deformed, the conductive path by the conductive particles may be bent or stretched. In this case, only the distance between the conductive particles is changed, but the conductive path formed by the conductive particles may still transmit the electrical signal. Therefore, in the stretchable display device 100 according to the first exemplary embodiment of the present disclosure, the space occupied by the connection line 180 may be minimized.

In the meantime, in the stretchable display device 100 according to the first exemplary embodiment of the present disclosure, the upper substrate 120 may include a plurality of first upper patterns 120a and a second upper pattern 120b. The plurality of first upper patterns 120a may be disposed in an emission area of the upper substrate 120 where the LED 160 is disposed. Further, the second upper pattern 120b may be disposed in a non-emission area of the upper substrate 120 where the LED 160 is not disposed. As another example, the plurality of first upper patterns 120a may be disposed in an area of the upper substrate 120 overlapping the plurality of island substrates 111. Further, the second upper patterns 120b may be disposed in an area of the upper substrate 120 excluding the plurality of first upper patterns 120a. The second upper pattern 120b encloses the plurality of first upper patterns 120a and is disposed on the same plane as the first upper patterns 120a.

The plurality of first upper patterns 120a disposed in the emission area may be configured of a stretchable transparent polymer material, for example, polydimethylsiloxane (PDMS). Further, the second upper pattern 120b disposed in the non-emission area may be configured by a stretchable black polymer material, for example, a black polymer material in which a black pigment is added to polydimethylsiloxane (PDMS).

Therefore, the stretchable display device 100 is easily bent or stretched and external reflection of the display device may be effectively reduced even though the polarizer layer is not disposed. That is, the front reflection and the rear external light transmission of the emission area may be blocked. In this case, the black bank 115f may be removed. When the black bank 115f is applied together, an alignment process of the patterned upper substrate 120 may be easily performed.

That is, the polarizer layer of the related art may polarize light incident from the outside of the stretchable display device. The polarized light which passes through the polarizer layer to be incident into the stretchable display device may be reflected in the stretchable display device and thus a phase may be shifted. The light with a shifted phase may not pass through the polarizer layer. Therefore, the light which is incident into the stretchable display device from the outside of the stretchable device is not emitted to the outside of the stretchable display device again so that the external reflection of the stretchable display device may be reduced. However, a circular polarizer layer of the related art is not stretchable, so that it is difficult to apply the circular polarizer layer to the stretchable display device. Further, when PDMS which is the transparent polymer material is used for the upper and lower substrates, the external light is transmitted in a partial area so that the black luminosity may be lowered. Therefore, in the present disclosure, the stretchable black polymer material is applied to the patterned upper substrate 120 and thus the stretchable display device 100 may be easily bent and stretched. Further, in a state when the polarizer layer is not disposed, the external reflection of the display device 100 may be effectively reduced.

In the meantime, as described above, the connection line 180 may be formed on the bank 115*f* in the display area AA, but is not limited thereto and may be formed on the first planarizing layer 115*d*, which will be described in more detail with reference to a second exemplary embodiment of the present disclosure.

Figure 5:
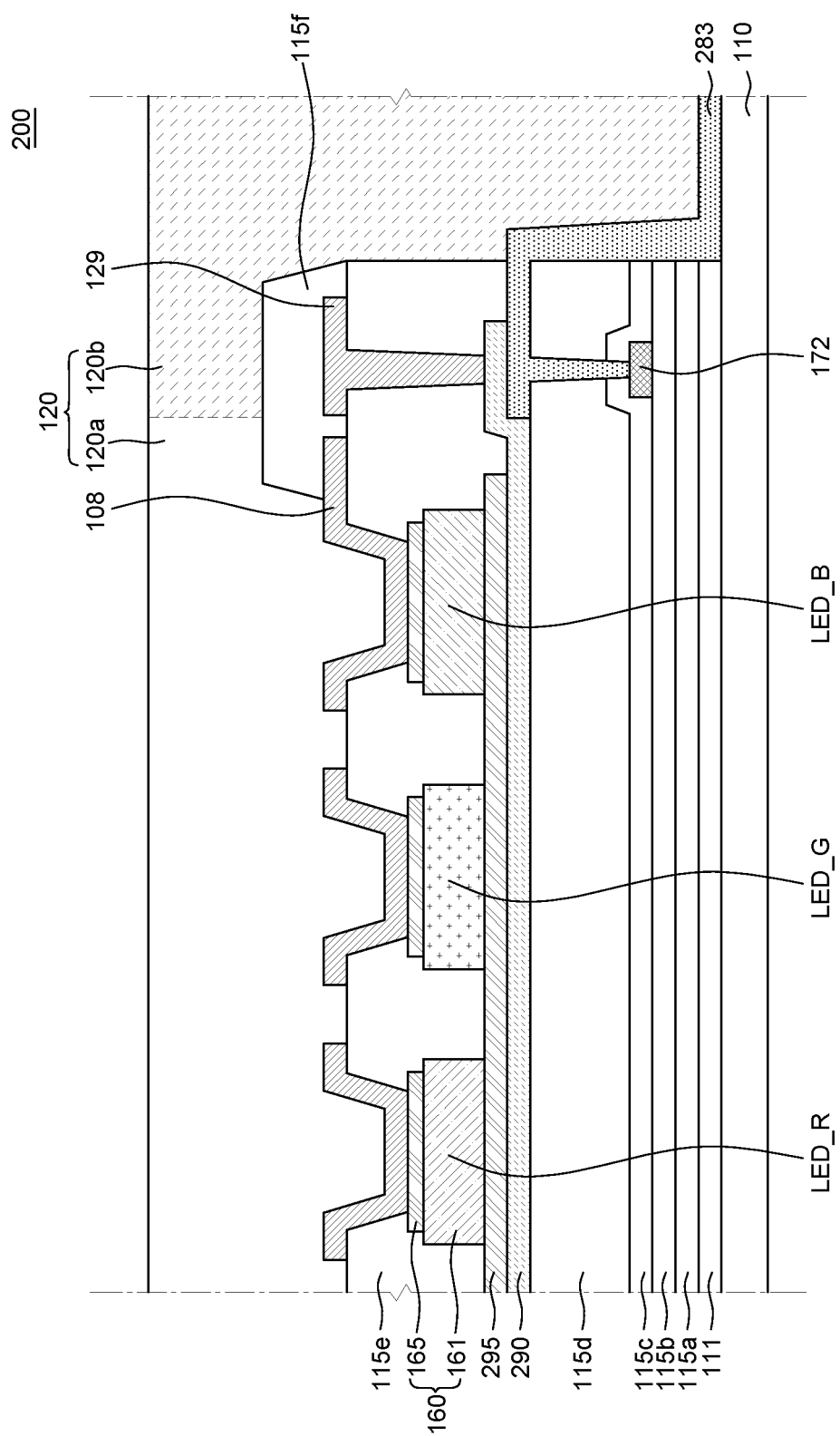
FIG. 5 is a cross-sectional view schematically illustrating a part of a cross-section of one pixel of a stretchable display device according to a second exemplary embodiment of the present disclosure.

FIG. 5 is a cross-sectional view schematically illustrating a part of a cross-section of one pixel of a stretchable display device according to a second exemplary embodiment of the present disclosure.

A stretchable display device 200 of FIG. 5 is substantially the same as the stretchable display device 100 of FIG. 4 except for a third connection line 283 so redundant descriptions will be omitted for the sake of brevity.

For the convenience of description, FIG. 5 illustrates a part of a cross-sectional structure for one pixel including a red sub pixel, a green sub pixel, and a blue sub pixel as an example.

In FIG. 5, LED_R, LED_G, and LED_B denote an LED of a red sub pixel, an LED of a green sub pixel, and an LED of a blue sub pixel, respectively. In the present disclosure, a micro LED is applied as an LED.

Referring to FIG. 5, a first planarizing layer 115*d* may be formed above the transistor 150 and the interlayer insulating layer 115*c*. The first planarizing layer 115*d* serves to planarize an upper portion of the transistor 150. The first planarizing layer 115*d* may be configured by a single layer or a plurality of layers and may be formed of an organic material. For example, the first planarizing layer 115*d* may be formed of an acrylic organic material, but is not limited thereto.

In some exemplary embodiments, a passivation layer may be formed between the transistor 150/the interlayer insulating layer 115*c* and the first planarizing layer 115*d*. That is, the passivation layer may be formed to cover the transistor 150 to protect the transistor 150 from the infiltration of the moisture and oxygen. The passivation layer may be formed of an inorganic material and configured by a single layer or a plurality of layers, but is not limited thereto.

On the first planarizing layer 115*d*, a connection line, for example, a third connection line 283 may be formed. The first planarizing layer 115*d* may include a contact hole which connects the third connection line 283 and the common line 172. Therefore, the third connection line 283 may be electrically connected to the common line 172 through a contact hole.

The common lines 172 are disposed above a plurality of island substrates 111 adjacent to each other in the X-axis direction and the common lines 172 disposed above a plurality of island substrates 111 adjacent to each other in the X-axis direction may be connected to each other by the third connection line 283. Therefore, the common line 172 disposed above the plurality of island substrates 111 and the third connection line 283 disposed on the lower substrate 110 may serve as one common line.

The third connection line 283 may include a base polymer and conductive particles.

In this case, the third connection line 283 may be formed to extend to an upper surface of the lower substrate 110 while being in contact with an upper surface and a side surface of the first planarizing layers 115*d*, and side surfaces of the interlayer insulating layer 115*c*, the gate insulating layer 115*b*, the buffer layer 115*a*, and the plurality of island substrates 111. Therefore, the third connection line 283 is in contact with the upper surface of the lower substrate 110, is in contact with the side surface of the adjacent island substrates 111, and is in contact with the side surfaces of the buffer layer 115*a*, the gate insulating layer 115*b*, and the interlayer insulating layer 115*c* disposed above the adjacent island substrates 111. Further, the third connection line 283 may be in contact with the upper surface and the side surface of the first planarizing layer 115*d* disposed in the adjacent island substrates 111, but is not limited thereto.

A reflective layer 290 may be disposed on the first planarizing layer 115*d*.

The reflective layer 290 is a layer which reflects light which is emitted to be directed to the lower substrate 110 among light emitted from the LED 160 onto an upper portion of the stretchable display device 200 to output the light to the outside. The reflective layer 290 may be formed of a metal material having a high reflectivity.

The stretchable display device 200 according to the second exemplary embodiment of the present disclosure combines individual RGB reflective layers as one reflective layer 290. That is, the reflective layer 290 according to the second exemplary embodiment of the present disclosure is not equipped for every sub pixel SPX, but may be integrally configured in one pixel PX formed of RGB sub pixels SPX. Therefore, even though the rigid area is reduced, a high-resolution stretchable display device 200 may be implemented using the existing micro LED.

Further, the stretchable display device 200 according to the second exemplary embodiment of the present disclosure uses the reflective layer 290 as a common electrode and is electrically connected to the third connection line 283.

Even though not illustrated in the drawing, a storage electrode is configured below the reflective layer 290 to configure a large-scale storage capacitor.

An adhesive layer 295 may be disposed on the reflective layer 290 to cover the reflective layer 290.

The adhesive layer 295 is a layer for bonding the LED 260 onto the reflective layer 290 and also insulates the reflective layer 290 formed of a metal material from the LED 260. The adhesive layer 295 may be formed of a thermosetting material or a photo curable material, but the present disclosure is not limited thereto.

The LED 160 may be disposed on the adhesive layer 295. The LED 160 may be disposed to overlap the reflective layer 290. The RGB LED 160 may be disposed on one reflective layer 290.

In the meantime, the lower substrate of the present disclosure may include a plurality of rigid patterns and a flexible pattern, which will be described in more detail with reference to a third exemplary embodiment of the present disclosure.

Figure 6:
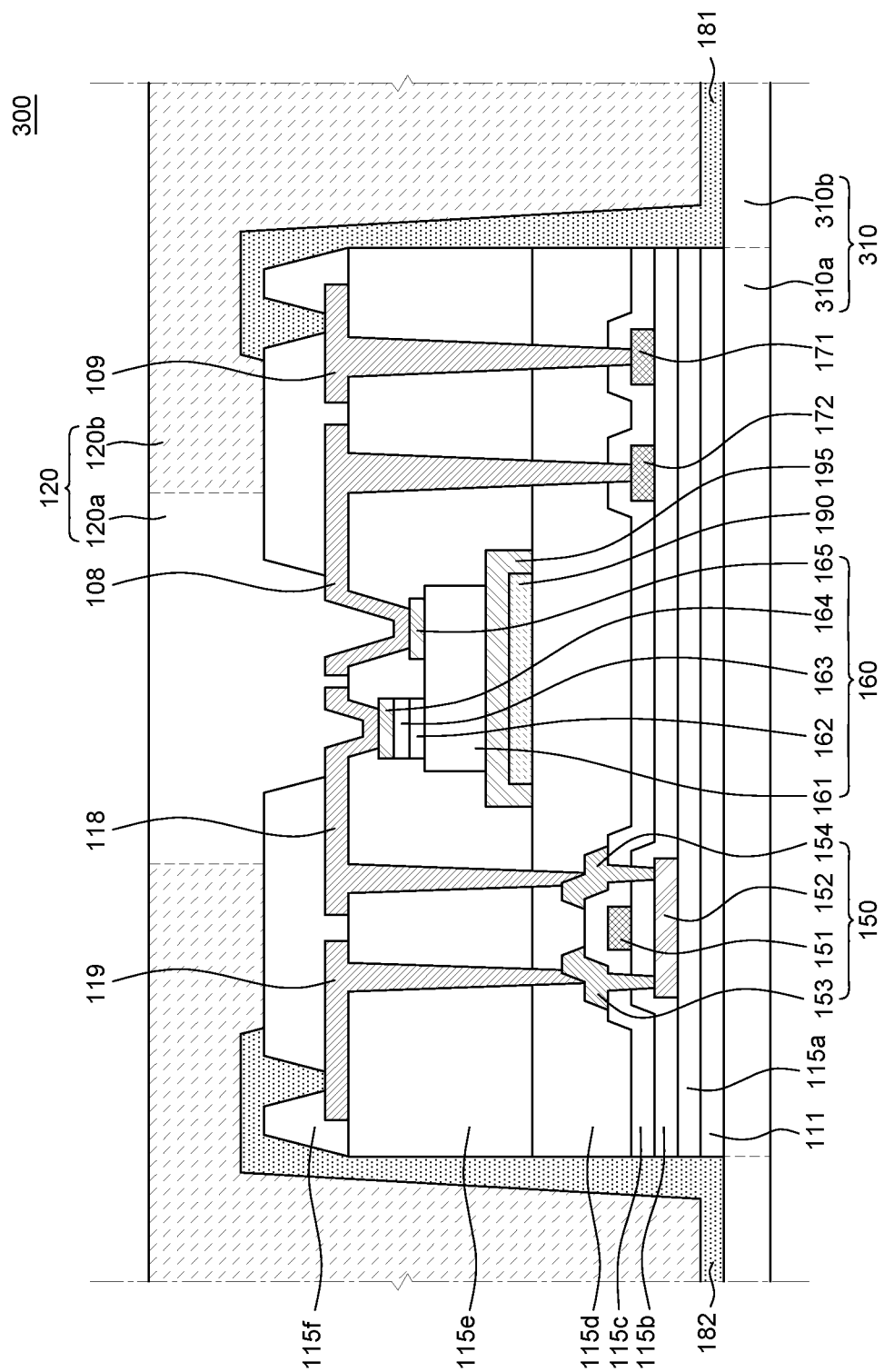
FIG. 6 is a cross-sectional view schematically illustrating one sub pixel of a stretchable display device according to a third exemplary embodiment of the present disclosure.
Figure 7:
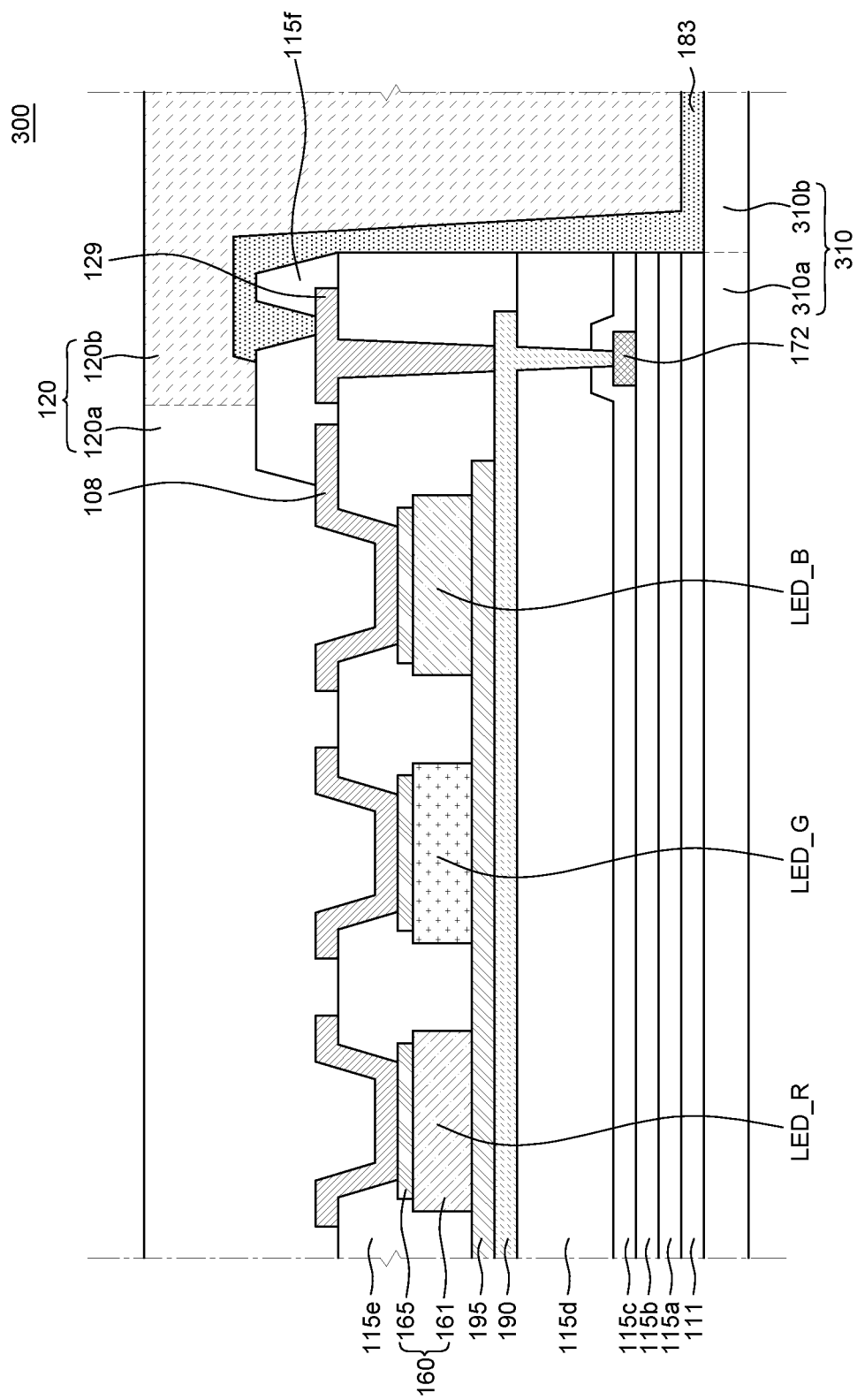
FIG. 7 is a cross-sectional view schematically illustrating a part of a cross-section of one pixel of a stretchable display device according to a third exemplary embodiment of the present disclosure.

FIG. 6 is a cross-sectional view schematically illustrating one sub pixel of a stretchable display device according to a third exemplary embodiment of the present disclosure. FIG. 7 is a cross-sectional view schematically illustrating a part of a cross-section of one pixel of a stretchable display device according to a third exemplary embodiment of the present disclosure.

A stretchable display device 300 according to a third exemplary embodiment of the present disclosure illustrated in FIGS. 6 and 7 is substantially the same as the stretchable display device 100 of FIGS. 1 to 4 except for the lower substrate 310, so that redundant description will be omitted for the sake of brevity.

Referring to FIGS. 6 and 7, the lower substrate 310 may include a plurality of first lower patterns 310a and a second lower pattern 310b. The plurality of first lower patterns 310a may be disposed in an area of the lower substrate 310 overlapping the plurality of island substrates 111. The plurality of first lower patterns 310a is disposed below the plurality of island substrates 111 so that upper surfaces may be bonded to lower surfaces of the plurality of island substrates 111.

The second lower pattern 310b is disposed in an area of the lower substrate 310 excluding the plurality of first lower patterns 310a. The second lower pattern 310b encloses the plurality of first lower patterns 310a and is disposed on the same plane as the first plurality of lower patterns 310a. The second lower pattern 310b may be disposed below the connection line 180 and the second upper pattern 120b and the upper surface may be in contact with the lower surface of the connection line 180 and the lower surface of the second upper pattern 120b.

In this case, the modulus of the plurality of first lower patterns 310a may be larger than the modulus of the second lower pattern 310b. Therefore, the plurality of first lower patterns 310a may be a plurality of rigid lower patterns having a rigidity as compared with the second lower pattern 310b. Further, the second lower pattern 310b may be a flexible lower pattern having a flexibility as compared with the plurality of first lower patterns 310a. The modulus of the plurality of first lower patterns 310a may be 1000 times higher than the modulus of the second lower pattern 310b, but is not limited thereto.

The plurality of first lower patterns 310a is formed of the same material as the plurality of island substrates 111 and may be formed of a plastic material having flexibility. For example, the plurality of first lower patterns 310a may be formed of polyimide (PI), polyacrylate, and polyacetate. However, it is not limited thereto and the plurality of first lower patterns 310a may be formed of a material which has a modulus equal to or smaller than the modulus of the plurality of island substrates 111.

The second lower pattern 310b is disposed on the same plane as the first lower patterns 310a and encloses the plurality of first lower patterns 310a. The second lower pattern 310b is a flexible lower pattern and may be reversibly expanded and contracted and an elastic modulus of the second lower pattern 310b may be several MPa to several hundreds of MPa and an extension breakage ratio may be 100% or higher. Therefore, the second lower pattern 310b may be configured of a bendable or stretchable insulating material and the second lower pattern 310b may be formed of silicon rubber such as polydimethylsiloxane (PDMA) and elastomer such as polyurethane (PU), but is not limited thereto. In this case, the thickness of the second lower pattern 310b may be 10 μm to 1 mm and the thickness of the first lower pattern 310a may be 1 μm to the thickness of the second lower pattern 310b.

In the stretchable display device 300 according to the third exemplary embodiment of the present disclosure, the lower substrate 310 includes a plurality of first lower patterns 310a overlapping the plurality of island substrates 111 and a second lower pattern 310b excluding the plurality of first lower patterns 310a and a modulus of the plurality of first lower patterns 310a is larger than the modulus of the second lower pattern 310b. When the stretchable display device 300 is bent or stretched to be deformed, the plurality of first lower patterns 310a disposed below the plurality of island substrates 111 which is rigid substrates is rigid lower patterns to support the plurality of island substrates 111. Therefore, various elements disposed above the plurality of island substrates 111 may be supported by the plurality of first lower patterns 310a together with the plurality of island substrates 111 and the damage due to the deformation of the stretchable display device 300 may be reduced.

Further, when the stretchable display device 300 is bent or stretched to be deformed, since the plurality of first lower patterns 310a is formed of the same material as the plurality of island substrates 111 and has a higher modulus than the modulus of the second lower pattern 310b, the plurality of first lower pattern 310a may not be deformed to be stretched more than the plurality of island substrates 111. Further, the adhesion between the plurality of first lower patterns 310a and the plurality of island substrates 111 may be stably maintained. Therefore, in the stretchable display device 300 according to the third exemplary embodiment of the present disclosure, the adhesion between the plurality of first lower patterns 310a and the plurality of island substrates 111 may be firmly maintained. Further, even though the stretchable display device 300 is bent or stretched to be continuously deformed, the defect of the stretchable display device 300 may be reduced.

The second lower pattern 310b which does not overlap the plurality of island substrates 111 has a flexible property as compared with the plurality of first lower patterns 310a so that the area between the plurality of island substrates 111 where the second lower pattern 310b is disposed may be freely bent or stretched. Therefore, the connection line 180 which overlaps the second lower pattern 310b is also freely bent or stretched. Therefore, the deformation such as bending or stretching of the stretchable display device 300 according to the third exemplary embodiment of the present disclosure may be more easily performed.

In the meantime, the polymer material of the upper substrate may have different refractive indexes in the emission area and the non-emission area, which will be described in more detail with reference to a fourth exemplary embodiment of the present disclosure.

Figure 8:
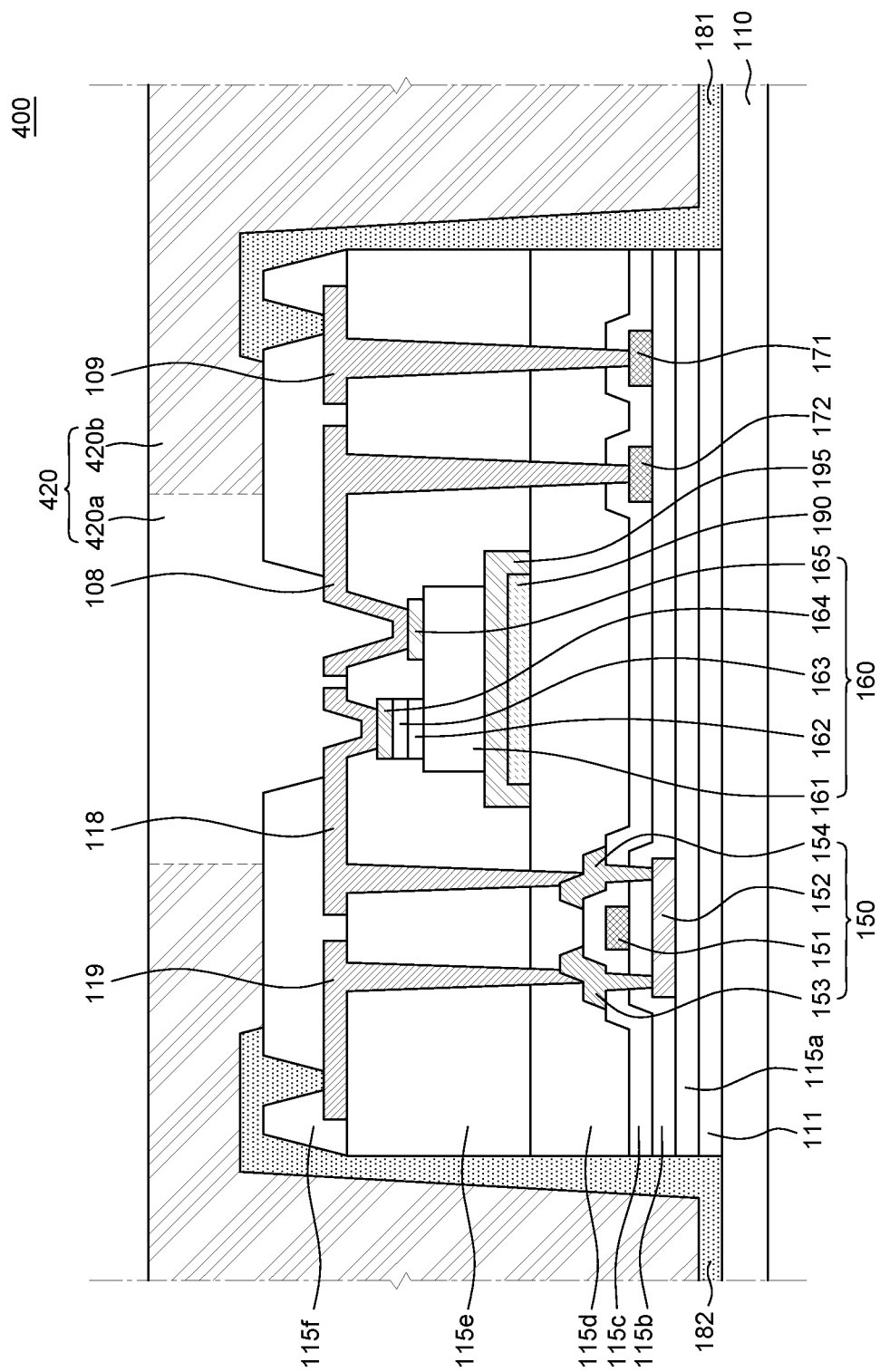
FIG. 8 is a cross-sectional view schematically illustrating one sub pixel of a stretchable display device according to a fourth exemplary embodiment of the present disclosure.
Figure 9:
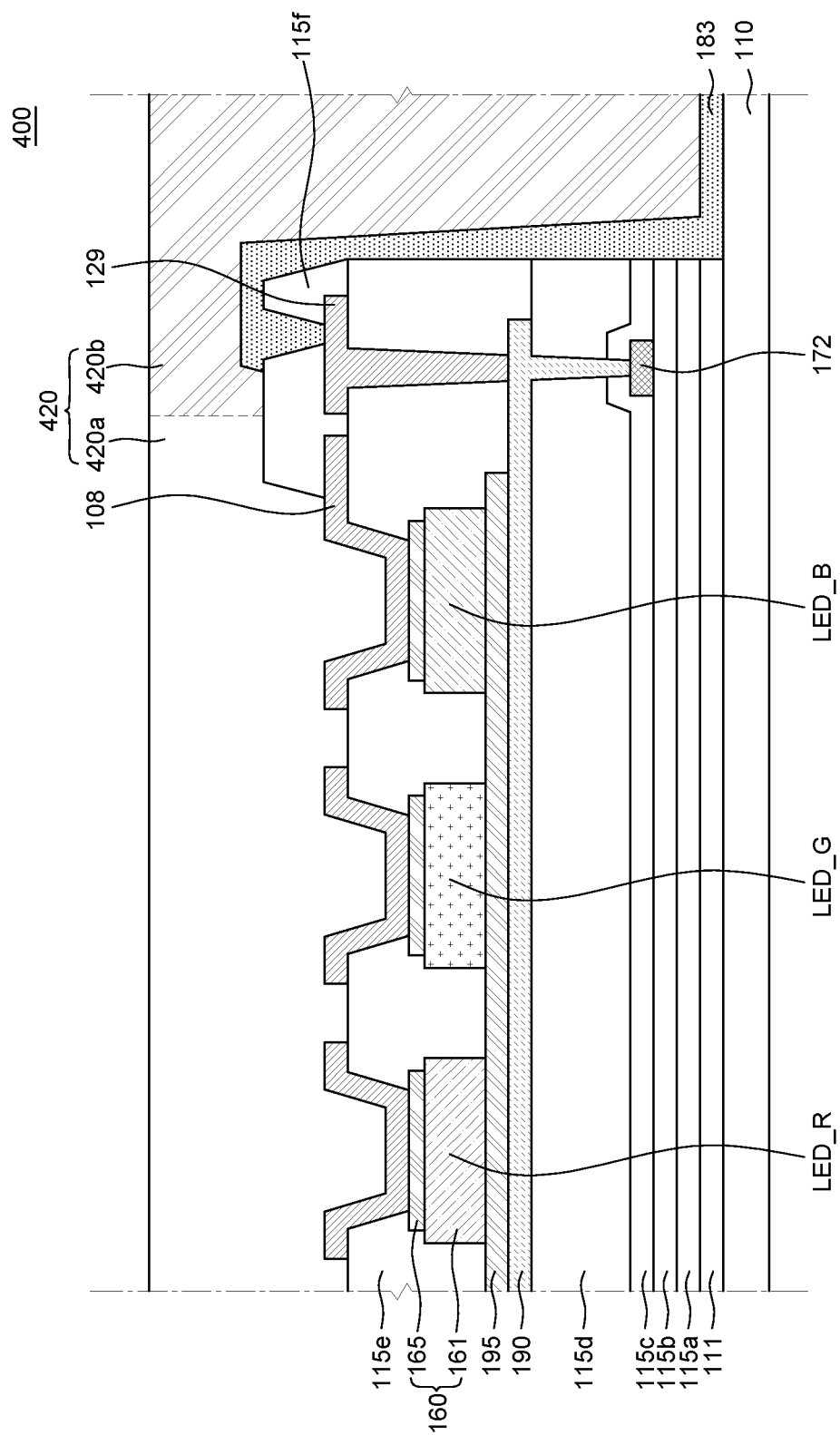
FIG. 9 is a cross-sectional view schematically illustrating a part of a cross-section of one pixel of a stretchable display device according to a fourth exemplary embodiment of the present disclosure.

FIG. 8 is a cross-sectional view schematically illustrating one sub pixel of a stretchable display device according to a fourth exemplary embodiment of the present disclosure. FIG. 9 is a cross-sectional view schematically illustrating a part of a cross-section of one pixel of a stretchable display device according to a fourth exemplary embodiment of the present disclosure.

A stretchable display device 400 according to a fourth exemplary embodiment of the present disclosure illustrated in FIGS. 8 and 9 is substantially the same as the stretchable display device 100 of FIGS. 1 to 4 except for an upper substrate 420, so that redundant description will be omitted for the sake of brevity.

Referring to FIGS. 8 and 9, the upper substrate 420 may include a plurality of first upper patterns 420*a* and a second upper pattern 420*b*. The plurality of first upper patterns 420*a* may be disposed in an emission area of the upper substrate 420 where the LED 160 is disposed. Further, the second upper patterns 420*b* may be disposed in a non-emission area of the upper substrate 420 where the LED 160 is not disposed. As another example, the plurality of first upper patterns 420*a* may be disposed in an area of the upper substrate 420 overlapping the plurality of island substrates 111. Further, the second upper patterns 420*b* may be disposed in an area of the upper substrate 420 excluding the plurality of first upper patterns 420*a*. The second upper pattern 420*b* encloses the plurality of first upper patterns 420*a* and is disposed on the same plane as the first upper patterns 420*a*.

In this case, the refractive index of the plurality of first upper patterns 420*a* may be larger than the refractive index of the second upper pattern 420*b*.

For example, the plurality of first upper patterns 420*a* may further include a first pigment and the second upper pattern 420*b* may further include a second pigment.

In this case, a refractive index of the first pigment may be higher than a refractive index of the second pigment.

In this case, the modulus of the plurality of first upper patterns 420*a* may be larger than the modulus of the second upper pattern 420*b*. Therefore, the plurality of first upper patterns 420*a* may be a plurality of rigid upper patterns having a rigidity as compared with the second upper pattern 420*b*. Further, the second upper pattern 420*b* may be a flexible upper pattern having a flexibility as compared with the plurality of first upper patterns 420*a*. The modulus of the plurality of first upper patterns 420*a* may be 1000 times higher than the modulus of the second upper pattern 420*b*, but is not limited thereto.

The plurality of first upper patterns 420*a* which is flexible upper patterns is formed of the same material as the plurality of first lower patterns 310*a* and may be formed of a plastic material having flexibility. For example, the plurality of first upper patterns may be formed of polyimide (PI), polyacrylate, and polyacetate, but, it is not limited thereto. However, the plurality of first upper patterns 420*a* may be formed of a material which has a modulus equal to or smaller than the modulus of the plurality of island substrates 111.

The second upper pattern 420*b* is a flexible upper pattern and may be configured by a bendable or stretchable insulating material. Therefore, the second upper pattern 420*b* may be reversibly expanded and contracted and an elastic modulus thereof may be several MPa to several hundreds of MPa and an extension breakage ratio may be 100% or higher.

The second upper pattern 420*b* may be formed of the same material as the second lower pattern 310*b* and for example, may be formed of a silicon rubber such as polydimethylsiloxane (PDMS) or an elastomer such as polyurethane (PU). Therefore, the upper substrate 120 may have a flexibility, but is not limited thereto.

In the meantime, in the present disclosure, the stretchable black polymer material may be applied not only to a patterned upper substrate, but also to the pattern lower substrate, which will be described in more detail with reference to a fifth exemplary embodiment of the present disclosure.

Figure 10:
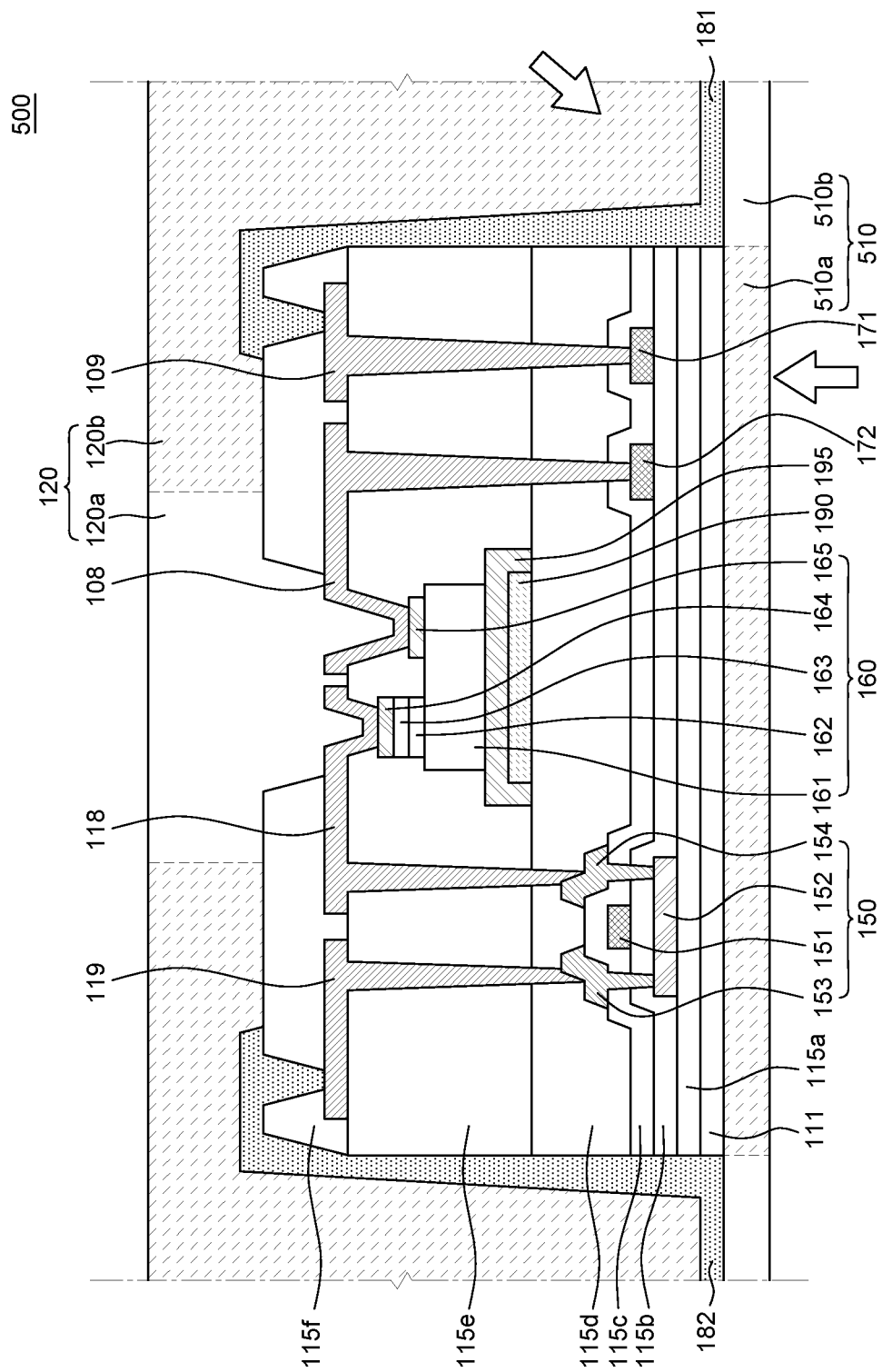
FIG. 10 is a cross-sectional view schematically illustrating one sub pixel of a stretchable display device according to a fifth exemplary embodiment of the present disclosure.
Figure 11:
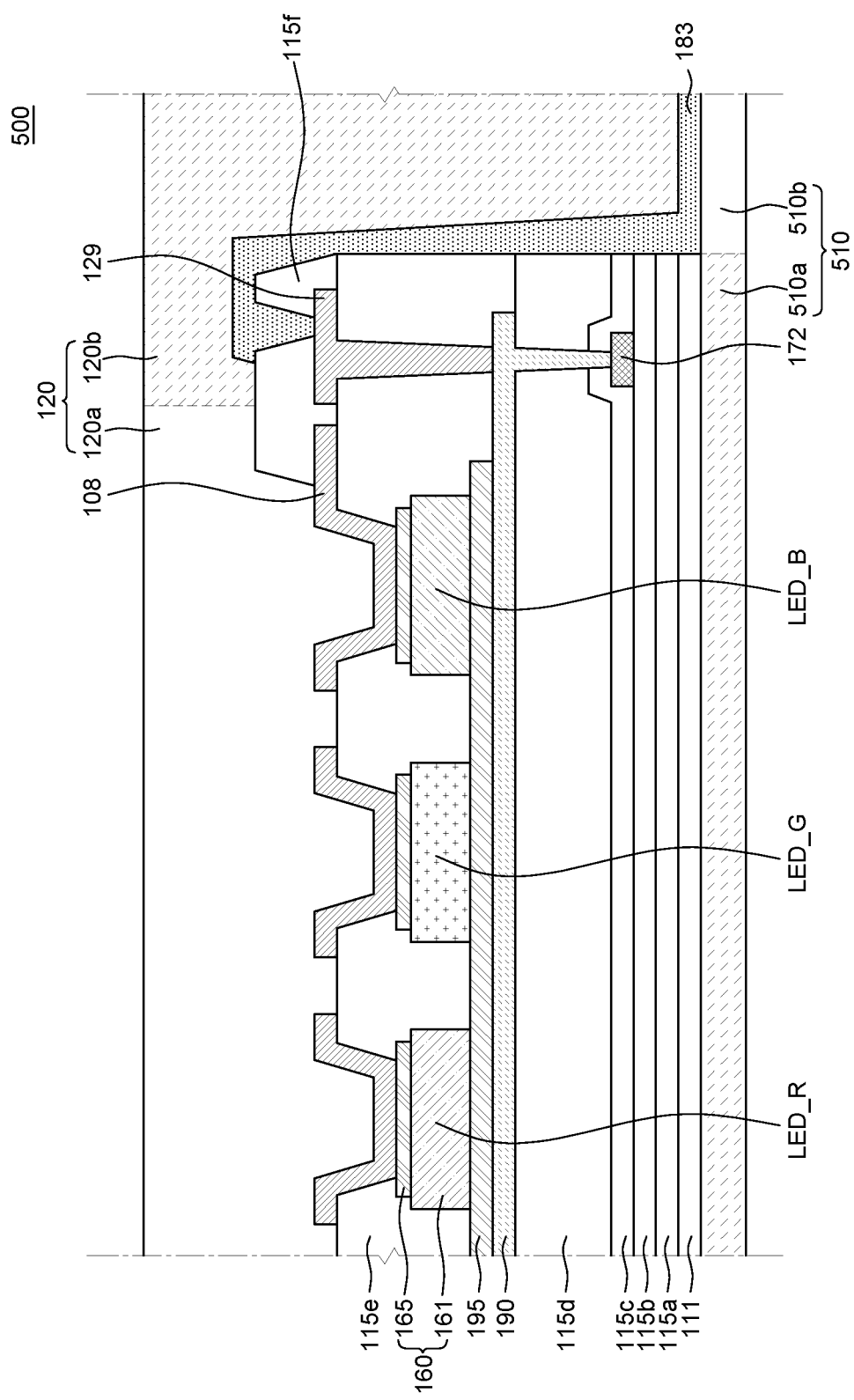
FIG. 11 is a cross-sectional view schematically illustrating a part of a cross-section of one pixel of a stretchable display device according to a fifth exemplary embodiment of the present disclosure.

FIG. 10 is a cross-sectional view schematically illustrating one sub pixel of a stretchable display device according to a fifth exemplary embodiment of the present disclosure. FIG. 11 is a cross-sectional view schematically illustrating a part of a cross-section of one pixel of a stretchable display device according to a fifth exemplary embodiment of the present disclosure.

A stretchable display device 500 according to a fifth exemplary embodiment of the present disclosure illustrated in FIGS. 9 and 10 is substantially the same as the stretchable display device 100 of FIGS. 1 to 4 except for a lower substrate 510, so that redundant description will be omitted for the sake of brevity.

Referring to FIGS. 9 and 10, in the stretchable display device 500 according to a fifth exemplary embodiment of the present disclosure, a lower substrate 510 may include a plurality of first lower patterns 510*a* and a second lower pattern 510*b*. The plurality of first lower patterns 510*a* may be disposed in an area of the lower substrate 510 overlapping the plurality of island substrates 111. Further, the second lower patterns 510*b* may be disposed in an area of the lower substrate 510 excluding the plurality of first lower patterns 510*a*. The second lower pattern 510*b* encloses the plurality of first lower patterns 510*a* and is disposed on the same plane as the first lower patterns 510*a*.

The second lower patterns 510*b* may be configured of a stretchable transparent polymer material, for example, polydimethylsiloxane (PDMS). Further, the plurality of second lower patterns 510*b* may be configured by a stretchable black polymer material, for example, a black polymer material in which a black pigment is added to polydimethylsiloxane (PDMS).

Therefore, the stretchable display device 500 is easily bent or stretched and external reflection of the display device may be effectively reduced even though the polarizer layer is not disposed. That is, the front reflection and the rear external light transmission of the emission area may be blocked. In this case, the black bank 115*f* may be removed and the black light leakage is improved so that the high contrast stretchable display device 500 may be implemented.

The exemplary embodiments of the present disclosure can also be described as follows.

According to an aspect of the present disclosure, there is provided a stretchable display device. The stretchable display device includes a plurality of island substrates which defines a plurality of pixels and is spaced apart from each other, a lower substrate disposed below the plurality of island substrates and a connection line which electrically connects pads disposed on adjacent island substrates among the plurality of island substrates, wherein the upper substrate is made of a stretchable polymer material and includes a plurality of upper patterns overlapping an emission area of the plurality of island substrates and a second upper pattern in an area excluding the plurality of first upper patterns, and wherein the second upper pattern further includes a black pigment.

The lower substrate may include a plurality of first lower patterns overlapping the plurality of island substrates and a second lower pattern in an area excluding the plurality of lower patterns.

A modulus of the plurality of first lower patterns may be larger than a modulus of the second lower pattern.

The plurality of first lower patterns may be made of the same material as the plurality of island substrates.

A modulus of the plurality of first upper patterns may be larger than a modulus of the second upper pattern.

The plurality of first upper patterns may be made of the same material as the plurality of first lower patterns and the second upper pattern may be made of the same material as the second lower pattern.

The stretchable polymer material may include polydimethylsiloxane (PDMS).

The stretchable display device may further include a gate line, a high potential power source line, and a low potential power source line disposed above the plurality of island substrates in one direction and a data line disposed above the plurality of island substrates in a different direction.

The stretchable display device may further include a reflective layer disposed above the plurality of island substrates, an adhesive layer disposed on the reflective layer and an RGB LED disposed on the adhesive layer to overlap the reflective layer.

The reflective layer may be electrically connected to the low potential power source line.

The connection line may be electrically connected to the low potential power source line through a contact hole or a connection pad.

The connection line may be include a base polymer and conductive particles dispersed in the base polymer.

According to another aspect of the present disclosure, there is provided a stretchable display device. The stretchable display device includes a plurality of island substrates which defines a plurality of pixels and is spaced apart from each other, a lower substrate disposed below the plurality of island substrates and a connection line which electrically connects pads disposed on adjacent island substrates among the plurality of island substrates, wherein the upper substrate is made of a stretchable polymer material and includes a plurality of first upper patterns overlapping an emission area of the plurality of island substrates and a second upper pattern in an area excluding the plurality of first upper patterns, and wherein a refractive index of the plurality of first upper patterns is larger than a refractive index of the second upper pattern.

The lower substrate may include a plurality of first lower patterns overlapping the plurality of island substrates and a second lower pattern in an area excluding the plurality of first lower patterns.

A modulus of the plurality of first lower patterns may be larger than a modulus of the second lower pattern.

The stretchable polymer material may include polydimethylsiloxane (PDMS).

The first upper pattern may further include a first pigment, the second upper pattern may further include a second pigment, and a refractive index of the first pigment may be larger than a refractive index of the second pigment.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A stretchable display device, comprising:
   a plurality of island substrates which defines a plurality of pixels and is spaced apart from each other;
   a lower substrate disposed below the plurality of island substrates;
   an upper substrate; and
   a connection line which electrically connects pads disposed on adjacent island substrates among the plurality of island substrates,
   wherein the upper substrate is made of a stretchable polymer material and includes a plurality of first upper patterns overlapping an emission area of the plurality of island substrates and a second upper pattern in an area excluding the plurality of first upper patterns, and
   wherein the second upper pattern further includes a black pigment.

2. The stretchable display device according to claim 1, wherein the lower substrate includes a plurality of first lower patterns overlapping the plurality of island substrates and a second lower pattern in an area excluding the plurality of lower patterns.

3. The stretchable display device according to claim 2, wherein a modulus of the plurality of first lower patterns is larger than a modulus of the second lower pattern.

4. The stretchable display device according to claim 3, wherein the plurality of first lower patterns is made of a same material as the plurality of island substrates.

5. The stretchable display device according to claim 1, wherein a modulus of the plurality of first upper patterns is larger than a modulus of the second upper pattern.

6. The stretchable display device according to claim 5, wherein the plurality of first upper patterns is made of a same material as a plurality of first lower patterns and
   wherein the second upper pattern is made of a same material as a second lower pattern.

7. The stretchable display device according to claim 1, wherein the stretchable polymer material includes polydimethylsiloxane (PDMS).

8. The stretchable display device according to claim 1, further comprising:
   a gate line, a high potential power source line, and a low potential power source line disposed above the plurality of island substrates in one direction; and
   a data line disposed above the plurality of island substrates in a different direction than the one direction.

9. The stretchable display device according to claim 8, further comprising:
   a reflective layer disposed above the plurality of island substrates;
   an adhesive layer disposed on the reflective layer; and
   an RGB light emitting diode (LED) disposed on the adhesive layer to overlap the reflective layer.

10. The stretchable display device according to claim 9, wherein the reflective layer is electrically connected to the low potential power source line.

11. The stretchable display device according to claim 8, wherein the connection line is electrically connected to the low potential power source line through a contact hole or a connection pad.

12. The stretchable display device according to claim 1, wherein the connection line includes a base polymer and conductive particles dispersed in the base polymer.

13. A stretchable display device, comprising:
   a plurality of island substrates which defines a plurality of pixels and is spaced apart from each other;
   a lower substrate disposed below the plurality of island substrates;
   an upper substrate; and a connection line which electrically connects pads disposed on adjacent island substrates among the plurality of island substrates, wherein the upper substrate is made of a stretchable polymer material and includes a plurality of first upper patterns overlapping an emission area of the plurality of island substrates and a second upper pattern in an area excluding the plurality of first upper patterns, and wherein a refractive index of the plurality of first upper patterns is larger than a refractive index of the second upper pattern, wherein the lower substrate includes a plurality of first lower patterns overlapping the plurality of island substrates and a second lower pattern in an area excluding the plurality of first lower patterns.

14. The stretchable display device according to claim 13, wherein a modulus of the plurality of first lower patterns is larger than a modulus of the second lower pattern.

15. The stretchable display device according to claim 13, wherein the stretchable polymer material includes polydimethylsiloxane (PDMS).

16. The stretchable display device according to claim 13, wherein the plurality of first upper patterns further include a first pigment, the second upper pattern further includes a second pigment, and a refractive index of the first pigment is larger than a refractive index of the second pigment.

* * * * *